United States Patent
Jenkins

(10) Patent No.: US 9,916,763 B2
(45) Date of Patent: Mar. 13, 2018

(54) VISIBILITY EVENT NAVIGATION METHOD AND SYSTEM

(71) Applicant: PRIMAL SPACE SYSTEMS, INC., Raleigh, NC (US)

(72) Inventor: Barry L. Jenkins, Pottsville, PA (US)

(73) Assignee: PRIMAL SPACE SYSTEMS, INC., Raleigh, NC (US)

( * ) Notice: Subject to any disclaimer, the term of this patent is extended or adjusted under 35 U.S.C. 154(b) by 194 days.

(21) Appl. No.: 15/044,956

(22) Filed: Feb. 16, 2016

(65) Prior Publication Data

US 2016/0163205 A1 Jun. 9, 2016

Related U.S. Application Data

(63) Continuation-in-part of application No. 14/082,997, filed on Nov. 18, 2013, now Pat. No. 9,620,469, and (Continued)

(51) Int. Cl.
*G08G 5/00* (2006.01)
*G06T 17/05* (2011.01)
(Continued)

(52) U.S. Cl.
CPC ......... *G08G 5/0069* (2013.01); *G05D 1/0022* (2013.01); *G06T 15/40* (2013.01);
(Continued)

(58) Field of Classification Search
CPC ..... G08G 5/0069; G06T 127/05; G06T 15/40; G05D 1/0022; H01L 23/3157;
(Continued)

(56) References Cited

U.S. PATENT DOCUMENTS 5,553,206 A 9/1996 Meshkat
5,914,721 A 6/1999 Lim
(Continued)

FOREIGN PATENT DOCUMENTS

CN 1305619 A 7/2001
CN 1691069 A 11/2005
(Continued)

OTHER PUBLICATIONS

Aila, Timo. "SurRender Umbra: A Visibility Determination Framework for Dynamic Environments." MS thesis. Helsinki U of Technology, 2000. Print.
(Continued)

*Primary Examiner* — Russell Frejd
(74) *Attorney, Agent, or Firm* — Oblon, McClelland, Maier & Neustadt, L.L.P.

(57) ABSTRACT

A method of visibility event navigation includes receiving, via processing circuitry of a client device, a first visibility event packet from a server, the first visibility event packet including information representing 3D surface elements of an environmental model that are occluded from a first viewcell and not occluded from a second viewcell, the first and second viewcells representing spatial regions of a specified navigational route within a real environment modeled by the environmental model. The method also includes acquiring, surface information representing the visible surfaces of the real environment at a sensor and determining, a position in the real environment by matching the surface information to the visibility event packet information. The method further includes transmitting, the position from the client device to the server and receiving a second visibility event packet from the server if the at least one position is within the specified navigational route.

26 Claims, 17 Drawing Sheets

Related U.S. Application Data a continuation-in-part of application No. 15/013,784, filed on Feb. 2, 2016, application No. 15/044,956, which is a continuation-in-part of application No. 13/420,436, filed on Mar. 14, 2012, now abandoned, which is a continuation-in-part of application No. PCT/US2011/051403, filed on Sep. 13, 2011, which is a continuation of application No. PCT/US2011/042309, filed on Jun. 29, 2011, said application No. 13/420,436 is a continuation-in-part of application No. PCT/US2011/042309, filed on Jun. 29, 2011, application No. 15/044,956, which is a continuation-in-part of application No. 13/807,824, filed as application No. PCT/US2011/042309 on Jun. 29, 2011, now Pat. No. 9,472,019.

(60) Provisional application No. 62/116,604, filed on Feb. 16, 2015, provisional application No. 62/110,774, filed on Feb. 2, 2015, provisional application No. 61/476,819, filed on Apr. 19, 2011, provisional application No. 61/474,491, filed on Apr. 12, 2011, provisional application No. 61/452,330, filed on Mar. 14, 2011, provisional application No. 61/384,284, filed on Sep. 19, 2010, provisional application No. 61/382,056, filed on Sep. 13, 2010, provisional application No. 61/360,283, filed on Jun. 30, 2010.

(51) Int. Cl.
*G06T 15/40* (2011.01)
*G05D 1/00* (2006.01)
*H01L 23/00* (2006.01)
*H01L 23/31* (2006.01)

(52) U.S. Cl.
CPC .......... *G06T 17/05* (2013.01); *H01L 23/3157* (2013.01); *H01L 24/03* (2013.01); *H01L 24/05* (2013.01); *H01L 24/13* (2013.01); *H01L 23/3114* (2013.01); *H01L 24/11* (2013.01); *H01L 2224/0345* (2013.01); *H01L 2224/0347* (2013.01); *H01L 2224/03452* (2013.01); *H01L 2224/03462* (2013.01); *H01L 2224/03464* (2013.01); *H01L 2224/03912* (2013.01); *H01L 2224/0401* (2013.01); *H01L 2224/05008* (2013.01); *H01L 2224/05022* (2013.01); *H01L 2224/05027* (2013.01); *H01L 2224/05124* (2013.01); *H01L 2224/05147* (2013.01); *H01L 2224/05166* (2013.01); *H01L 2224/05186* (2013.01); *H01L 2224/05569* (2013.01); *H01L 2224/05583* (2013.01); *H01L 2224/05655* (2013.01); *H01L 2224/05681* (2013.01); *H01L 2224/05686* (2013.01); *H01L 2224/11* (2013.01); *H01L 2224/11334* (2013.01); *H01L 2224/13022* (2013.01); *H01L 2224/13024* (2013.01); *H01L 2224/13111* (2013.01); *H01L 2224/13113* (2013.01); *H01L 2224/13116* (2013.01); *H01L 2224/13139* (2013.01); *H01L 2224/13147* (2013.01); *H01L 2224/13155* (2013.01); *H01L 2224/13561* (2013.01); *H01L 2224/13611* (2013.01); *H01L 2224/13613* (2013.01); *H01L 2224/13616* (2013.01); *H01L 2224/13639* (2013.01); *H01L 2224/13647* (2013.01); *H01L 2224/13655* (2013.01); *H01L 2224/13681* (2013.01); *H01L 2224/13686* (2013.01); *H01L 2924/181* (2013.01)

(58) Field of Classification Search
CPC ......... H01L 24/03; H01L 24/05; H01L 24/13; H01L 2224/05027; H01L 2224/05569; H01L 2924/181; H01L 2224/13561; H01L 2224/13681; H01L 2224/13686; H01L 23/3114; H01L 24/11; H01L 2224/0345; H01L 2224/03452; H01L 2224/03462; H01L 2224/03464; H01L 2224/0347; H01L 2224/0401; H01L 2224/05008; H01L 2224/05022; H01L 2224/05124; H01L 2224/05147; H01L 2224/05166; H01L 2224/05186; H01L 2224/05655; H01L 2224/05681; H01L 2224/05686; H01L 2224/11; H01L 2224/11334; H01L 2224/13022; H01L 2224/13024; H01L 2224/13111; H01L 2224/13616; H01L 2224/05583; H01L 2224/13113; H01L 2224/13116; H01L 2224/13139; H01L 2224/13147; H01L 2224/13155; H01L 2224/13611; H01L 2224/13613; H01L 2224/13639; H01L 2224/13647; H01L 2224/13655; H01L 2224/03912

See application file for complete search history.

(56) References Cited

U.S. PATENT DOCUMENTS

| | | |
|---|---|---|
| 5,999,187 A | 12/1999 | Dehmlow et al. |
| 6,028,608 A | 2/2000 | Jenkins |
| 6,057,847 A | 5/2000 | Jenkins |
| 6,111,582 A | 8/2000 | Jenkins |
| 6,259,452 B1 | 7/2001 | Coorg et al. |
| 6,782,130 B2 | 8/2004 | Guo |
| 6,933,946 B1 | 8/2005 | Silva et al. |
| 8,058,726 B1 | 11/2011 | Jin et al. |
| 2002/0020855 A1 | 2/2002 | Hwang |
| 2002/0025585 A1 | 2/2002 | Lam et al. |
| 2002/0167518 A1 | 11/2002 | Migdal et al. |
| 2003/0164552 A1 | 9/2003 | Tong et al. |
| 2005/0062169 A1 | 3/2005 | Dubin et al. |
| 2006/0001974 A1 | 1/2006 | Uehara et al. |
| 2006/0082571 A1 | 4/2006 | McDaniel |
| 2006/0204650 A1 | 9/2006 | Hu |
| 2007/0045869 A1 | 3/2007 | Ho et al. |
| 2007/0206008 A1 | 9/2007 | Kaufman et al. |
| 2007/0252275 A1 | 11/2007 | Huang et al. |
| 2008/0180440 A1 | 7/2008 | Stich |
| 2009/0014869 A1 | 1/2009 | Vrtis et al. |
| 2009/0207169 A1 | 8/2009 | Wakayama |
| 2009/0276541 A1 | 11/2009 | Lock et al. |
| 2010/0013100 A1 | 1/2010 | Xiao et al. |
| 2010/0045670 A1 | 2/2010 | O'Brien et al. |
| 2010/0060640 A1 | 3/2010 | Melikian et al. |
| 2010/0155115 A1 | 6/2010 | Pang et al. |
| 2012/0229445 A1 | 9/2012 | Jenkins |
| 2012/0256915 A1* | 10/2012 | Jenkins .................. G06T 15/40 345/419 |
| 2013/0147031 A1 | 6/2013 | Chen et al. |
| 2013/0193570 A1 | 8/2013 | Kuo et al. |
| 2013/0207976 A1* | 8/2013 | Jenkins .................. G06T 15/60 345/420 |
| 2015/0269770 A1* | 9/2015 | Jenkins .................. G06T 15/40 345/421 |
| 2016/0005214 A1* | 1/2016 | Jenkins .................. G06T 15/60 345/422 |

FOREIGN PATENT DOCUMENTS

| | | |
|---|---|---|
| CN | 1696978 A | 11/2005 |
| CN | 1806260 A | 7/2006 |
| CN | 101145245 A | 3/2008 |

(56) References Cited

FOREIGN PATENT DOCUMENTS

| | | |
|---|---|---|
| CN | 101149842 A | 3/2008 |
| JP | 2004-45266 A | 2/2004 |

OTHER PUBLICATIONS

Aila, Timo, and Ville Miettinen. "dPVS: An Occlusion Culling System for Massive Dynamic Environments." IEEE Computer Graphics and Applications 24.2 (2004): 86-97.
Aila, Timo, Ville Miettinen, and Otso Makinen. "DPVS Reference Manual." Aug. 2006. PDF file.
Aliaga, Daniel, et al. "MMR: An Interactive Massive Model Rendering System Using Geometric And Image-Based Acceleration." Proceedings of the 1999 Symposium on Interactive 3D Graphics . Proc. of Symposium on Interactive 3D Graphics, Apr. 1999, Atlanta. New York: ACM, 1999. 199-206. ACM Portal. Web. Jun. 9, 2010. <http://portal.acm.org>.
Aliaga, Daniel G., et al. "Sea of Images." Proceedings of the Conference on Visualization '02. Washington, DC: IEEE Computer Society, 2002. 331-38. ACM Portal. Web. Jun. 20, 2010. <http://portal.acm.org>.
Amanatides, John, and Andrew Woo. "A Fast Voxel Traversal Algorithm for Ray Tracing." Paper presented at Eurographics 1987. PDF file.
Bajaj, Chandrajit. "Computational Visualization." N.d. PDF file. Dec. 11-15, 2002.
Banerjee, Raja, and Jarek R. Rossignac. "Topologically Exact Evaluation of Polyhedra Defined in CSG with Loose Primitives." Computer Graphics Forum 15.4 (1996): 205-17. Print.
Batagelo, Harlen Costa, and Shin-Ting Wu. "Dynamic Scene Occlusion Culling using a Regular Grid." Proceedings of the 15th Brazilian Symposium on Computer Graphics and Image Processing. Washington, DC: IEEE Computer Society, 2002. 43-50. ACM Portal. Web. Jun. 21, 2010. <http://portal.acm.org>.
Bernardini, Fausto, Jihad El-Sana, and James T. Klosowski. "Directional Discretized Occluders for Accelerated Occlusion Culling." Eurographics '2000. Ed. M. Gross and F. R. A. Hopgood. vol. 19. N.p.: n.p., n.d. N. pag. Print.
Bittner, Jiri. "Efficient Construction of Visibility Maps using Approximate Occlusion Sweep." Proceedings of the 18th Spring Conference on Computer Graphics . New York: ACM, 2002. 167-175. ACM Portal. Web. Jun. 24, 2010. <http://portal.acm.org>.
"Hierarchical Techniques for Visibility Computations." Diss. Czech Technical U in Prague, 2002. Print.
Bittner, Jiri, Vlastimil Havran, and Pavel Slavik. "Hierarchical Visibility Culling with Occlusion Trees." Proceedings of the Computer Graphics International 1998. Washington, DC: IEEE Computer Society, 1998. 207. ACM Portal. Web. Jun. 19, 2010. <http://portal.acm.org>.
Bittner, Jiri, and Michael Wimmer. Report on Visibility Algorithms. N.p.: n.p., 2005. Print.
Bittner, Jiri, et al. "Coherent Hierarchical Culling: Hardware Occlusion Queries Made Useful." Eurographics 2004. Ed. M.-P. Cani and M. Slater. vol. 23. Oxford: Blackwell Publishing, 2004. N. pag. Print.
Blythe, David. "The Direct3D 10 System." ACM Transactions on Graphics (TOG) 25.3 (2006): 724-34. ACM Portal. Web. Jun. 20, 2010. <http://portal.acm.org>.
Bronnimann, H., et al. "Lines Tangent to Four Triangles in Three-Dimensional Space." Discrete & Computational Geometry 37.3 (2007): 369-80. ACM Portal. Web. Jun. 27, 2010. <http://portal.acm.org>.
Bronnimann, H., et al. Transversals to Line Segments in R3. N.p.: n.p., 2003. Print.- -. Transversals to Line Segments in R3. N.p.: n.p., 2003. Print.
Brunet, Pere, and Isabel Navazo. "Solid Representation and Operation Using Extended Octrees." ACM Transactions on Graphics (TOG) 9.2 (1990): 170-97. Print.
Brunet, Pere, et al. "Hoops: 3D Curves as Conservative Occluders for Cell-Visibility." Eurographics 2001. Ed. A. Chalmers and T.-M. Rhyne. vol. 20. N.p.: n.p., n.d. N. pag. Print.
Butchart, J. H. "The Altitude Quadric of a Tetrahedron." The American Mathematical Monthly 47.6 (1940): 383-84. Print.
Campbell, A. T., III, and Donald S. Fussell. "Adaptive Mesh Generation for Global Diffuse Illumination." Proceedings of the 17th Annual Conference on Computer Graphics and Interactive Techniques . New York: ACM, 1990. 155-64. ACM Portal. Web. Jun. 24, 2010. <http://portal.acm.org>.
Cano, Pedro, and Juan Carlos Torres. Representation of Polyhedral Objects using SP-Octrees. Granada: n.p., n.d. Print. (created Jan. 5, 2002.).
Cano, Pedro, Juan Carlos Torres, and Francisco Velasco. "Progressive Transmission of Polyhedral Solids using a Hierarchical Representation Scheme." Journal of WSCG 11.1 (2003): n. pag. PDF file.
Chan, Timothy. "A Minimalist's Implementation of the 3-d Divide-and-Conquer Convex Hull Algorithm." Jun. 4, 2003. University of Waterloo School of Computer Science. Timothy M. Chan's Publications. Web. May 30, 2010. <http://www.cs.uwaterloo.ca/~tmchan/.html>.
Charneau, Sylvain, Lillian Aveneau, and Laurent Fuchs. "Exact, Robust and Efficient Full Visibility Computation in Plucker Space." The Visual Computer 23 (Jun. 2007): 773-82. Print.
Chen, Wei-Chao, et al. "Light Field Mapping: Hardware-Accelerated Visualization of Surface Light Fields." ACM Transactions on Graphics (TOG) 21.3 (2002): 447-56. ACM Portal. Web. Jun. 20, 2010. <http://portal.acm.org>.
Chhugani, Jatin. "High Fidelity Walkthroughs of Large Virtual Environments." Diss. The Johns Hopkins U, 2004. Print.
Chhugani, Jatin, et al. "vLOD: High-Fidelity Walkthrough of Large Virtual Environments." IEEE Transactions on Visualization and Computer Graphics 11.1 (2005): 35-47. ACM Portal. Web. Jun. 8, 2010. <http://portal.acm.org>.
Chin, Norman, and Steven Feiner. "Fast Object-Precision Shadow Generation for Area Light Sources Using BSP Trees." Proceedings of the 1992 Symposium on Interactive 3D Graphics . Proc. of Symposium on Interactive 3D Graphics, 1992, Cambridge, Massachusetts. New York: Association for Computing Machinery, 1992. 21-30. ACM Portal. Web. May 30, 2010. <http://portal.acm.org>.
Chin, Norman, and Steven Feiner, "Near Real-Time Shadow Generation Using BSP Trees." ACM SIGGRAPH Computer Graphics 23.3 (1989): 99-106. ACM Portal. Web. May 31, 2010. <http://portal.acm.org>.
Chrysanthou, Yiorgos, Daniel Cohen-Or, and Dani Lischinski. "Fast Approximate Quantitative Visibility for Complex Scenes." Proceedings of the Computer Graphics International 1998. Washington, DC: IEEE Computer Society, 1998. 220. ACM Portal. Web. Jun. 20, 2010. <http://portal.acm.org>.
Chrysanthou, Yiorgos, and Mel Slater. "Shadow Volume BSP Trees for Computation of Shadows in Dynamic Scenes." Proceedings of the 1995 Symposium on Interactive 3D Graphics . Proc. of Symposium on Interactive 3D Graphics, 1995, Monterey, California. New York: Association for Computing Machinery, 1995. 45-50. ACM Portal. Web. May 30, 2010. <http://portal.acm.org>.
Chrysanthou, Yiorgos, and Mel Slater. "Incremental Updates to Scenes Illuminated by Area Light Sources." Proceedings of the Eurographics Workshop on Rendering Techniques '97 . London: Springer-Verlag, 1997. 103-14. ACM Portal. Web. May 29, 2010. <http://portal.acm.org>.
Cohen, Jonathan. "Rendering Software Acceleration." Spring 2000. PDF file.
Cohen-Or, Daniel, et al. "A Survey of Visibility for Walkthrough Applications." IEEE Transactions on Visualization and Computer Graphics 9.3 (2003): 412-31. Print.
Cohen-Or, Daniel, et al. "Conservative Visibility and Strong Occlusion for Viewspace Partitioning of Densely Occluded Scenes." Eurographics '98. Comp. N. Ferreira and M. Gobel. vol. 17. N.p.: n.p., n.d. N. pag. Print. vol. 17, (1998) No. 3.
Cohen-Or, Daniel, and Eyal Zadicarlo. "Visibility Streaming for Network-Based Walkthroughs." Proceedings of Graphics Interface, 1998. N.p.: n.p., 1998. N. pag. Print.

(56) References Cited

OTHER PUBLICATIONS

Comba, Joao, and Bruce Naylor. "Conversion of Binary Space Partitioning Trees to Boundary Representation." Geometric Modeling: Theory and Practice: The State of the Art (Focus on Computer Graphics). Ed. Wolfgang Strasser, Reinhard Klein, and Rene Rau. N.p.: Springer Verlag, 1997. 286-301. Print.
Coorg, Satyan, and Seth Teller. "Temporally Coherent Conservative Visibility." Computational Geometry: Theory and Applications 12.1-2 (1999): 105-124. ACM Portal. Web. Jun. 19, 2010. <http://portal.acm.org>.
Coorg, Satyan, and Seth Teller. "Real-Time Occlusion Culling for Models with large Occluders." Proceedings of the 1997 Symposium on Interactive 3D Graphics . Symposium on Interactive 3D Graphics, Providence, RI. New York: ACM, 1997. 83-ff. ACM Portal. Web. Jun. 19, 2010. <http://portal.acm.org>.
Correa, Wagner T., James T. Klosowski, and Claudio T. Silva. "Fast and Simple Occlusion Culling." Game Programming Gems 3. Ed. Dante Treglia. N.p.: Charles River Media, 2002. N. pag. Print. Game Programming Gems ser. 3.
Correa, Wagner T., James T. Klosowski, and Claudio T. Silva. IWalk: Interactive Out-Of-Core Rendering of Large Models. N.p.: n.p., n.d. N. pag. Print. (modified Sep. 4, 2013).
Correa, Wagner T., James T. Klosowski, and Claudio T. Silva. "Out-of-Core Sort-First Parallel Rendering for Cluster-Based Tiled Displays." Proceedings of the Fourth Eurographics Workshop on Parallel Graphics and Visualization . vol. 29. Aire-la-Ville: Eurographics Association, 2002. 89-96. ACM Portal. Web. Jun. 20, 2010. <http://portal.acm.org>.
Correa, Wagner T., James T. Klosowski, and Claudio T. Silva. "Visibility-Based Prefetching for Interactive Out-Of-Core Rendering." Proceedings of the 2003 IEEE Symposium on Parallel and Large-Data Visualization and Graphics. Washington, DC: IEEE Computer Society, 2003. N. pag. ACM Portal. Web. Jun. 20, 2010. <http://portal.acm.org>.
Cozzi, Patrick John. "Visibility Driven Out-of-Core HLOD Rendering." MS thesis. U of Pennsylvania, 2008. Print.
Dachsbacher, Carsten, et al. "Implicit Visibility and Antiradiance for Interactive Global Illumination." ACM Transactions on Graphics (TOG) 26.3 (2007): n. pag. ACM Portal. Web. Jun. 20, 2010. <http://portal.acm.org>.
Decoret, Xavier, Gilles Debunne, and Francois Sillion. "Erosion Based Visibility Preprocessing." Proceedings of the 14th Eurographics Workshop on Rendering. Proc. of ACM International Conference Proceeding Series; vol. 44. Aire-la-Ville: Eurographics Association, 2003. 281-88. ACM Portal. Web. Jun. 8, 2010. <http://portal.acm.org>.
Demouth, Julien, et al. "Between Umbra and Penumbra." Proceedings of the Twenty-Third Annual Symposium on Computational Geometry . New York: ACM, 2007. 265-74. ACM Portal. Web. Jun. 29, 2010. <http://portal.acm.org>.
Drettakis, George, and Eugene Fiume. "A Fast Shadow Algorithm for Area Light Sources Using Backprojection." Proceedings of the 21st Annual Conference on Computer Graphics and Interactive Techniques . New York: ACM, 1994. 223-30. ACM Portal. Web. Jun. 27, 2010. <http://portal.acm.org>.
Drettakis, Georgios. Structured Sampling and Reconstruction of Illumination for Image Synthesis. Diss. U of Toronto, 1994. Toronto: UMI, 1994. AAINN92651. ACM Portal. Web. Jun. 24, 2010. <http://portal.acm.org>.
Durand, Fredo. "3D Visibility: Analytical Study and Applications." Diss. U of Grenoble, 1999. Print.
Durand, Fredo. "Some Thoughts on Visibility." N.d. PDF file. (created Oct. 18, 2000).
Durand, Fredo, George Drettakis, and Claude Puech. "The 3D Visibility Complex: A New Approach to the Problems of Accurate Visibility." Proceedings of the Eurographics Workshop on Rendering Techniques '96 . London: Springer-Verlag, 1996. 245-56. ACM Portal. Web. Jun. 30, 2010. <http://portal.acm.org>.
Durand, Fredo, et al. "Conservative Visibility Preprocessing using Extended Projections." Proceedings of the 27th Annual Conference on Computer Graphics and Interactive Techniques. Proc. of International Conference on Computer Graphics and Interactive Techniques. New York: ACM Press/Wesley Publishing Co., 2000. 239-48. ACM Portal. Web. Jun. 8, 2010. <http://portal.acm.org>.
Edelsbrunner, Herbert. "Triangulations and Meshes in Computational Geometry." Cambridge Journals 9 (Mar. 2001): 133-213. Cambridge Journals. Web. Jun. 20, 2010. <http://journals.cambridge.org>.
Eppstein, David. "Asymptotic Speed-Ups in Constructive Solid Geometry." Algorithmica 13.5 (1995): 462-471. Print.
Fogel, Efi, et al. "A Web Architecture for Progressive Delivery of 3D Content." Proceedings of the Sixth International Conference on 3D Web Technology. Proc. of Virtual Reality Modeling Language Symposium, Paderbon, Germany, 2001. New York: ACM, 2001. 35-41. ACM Portal. Web. Jun. 20, 2010. <http://portal.acm.org>.
Funkhouser, Thomas A. "Visibility." Spring 2006. PDF file.
Funkhouser, Thomas A. "A Visibility Algorithm for Hybrid Geometry-and Image-Based Modeling and Rendering." Computers and Graphics 23.5 (1999): 719-28. Print.
Funkhouser, Thomas A. "Database Management for Interactive Display of Large Architectural Models." Proceedings of the Conference on Graphics Interface '96. Toronto: Canadian Information Processing Society, 1996. 1-8. ACM Portal. Web. Jun. 20, 2010. <http://portal.acm.org>.
Ghali, Sherif. "A Geometric Framework for Computer Graphics Addressing Modeling, Visibility, and Shadows." N.d. HTML file. (Created Jun. 8, 1999).
Ghali, Sherif. "A Survey of Practical Object Space Visibility Algorithms." N.d. MS. Max Planck Institute for Computer Science, Saarbrucken. (Created May 14, 2001).
Ghali, Sherif. "Object Space Visibility." Paper presented at SIG-GRAPH 2001. PDF file.
Ghali, Sherif, and Chris Smith. "Computing the Boundary of a Class of Labeled-Leaf BSP Solids." Proceedings of the 17th Canadian Conference on Computational Geometry (CCCG'05). Proc. of Canadian Conference on Computational Geometry, 2005, Windsor, Ontario. N.p.: n.p., 2005. 302-5. The Canadian Conference on Computational Geometry. Web. May 29, 2010. <http://www.cccg.ca/>.
Gigus, Ziv, John Canny, and Raimund Seidel. Efficiently Computing and Representing Aspect Graphics of Polyhedral Objects. Berkeley: U of California, Berkeley, n.d. Print. (Created Sep. 13, 2002).
Gigus, Ziv, and Jitendra Malik. "Computing the Aspect Graph for Line Drawings of Polyhedral Objects." IEEE Transactions on Pattern Analysis and Machine Intelligence 12.2 (1990): 113-22. ACM Portal. Web. Jun. 27, 2010. <http://portal.acm.org>.
Goodrich, Michael T. "A Polygonal Approach to Hidden-Line and Hidden-Surface Elimination." CVGIP: Graphical Models and Image Processing 54.1 (1992): 1-12. ACM Portal. Web. Jun. 27, 2010. <http://portal.acm.org>.
Gorjanc, Sonja. Some Examples of using Mathematica in Teaching Geometry. Zagreb: U of Zagreb, n.d. N. pag. Print. (Created Aug. 29, 2013).
Gotsman, Craig, Oded Sudarsky, and Jeffrey A. Fayman. "Optimized Occlusion Culling Using Five-Dimensional Subdivision." Computers & Graphics 23.5: 645-54. Print. (1999).
Gran, Carlos Andujar. "Octree-Based Simplification of Polyhecral Solids." Diss. Polytechnical U of Catalunya, 1999. Print.
Gu, Xianfeng, Steven J. Gortler, and Michael F. Cohen. "Polyhedral Geometry and the Two-Plane Parameterization." Proceedings of the Eurographics Workshop on Rendering Techniques '97. London: Springer-Verlag, 1997. 1-12. ACM Portal. Web. Jun. 29, 2010. <http://portal.acm.org>.
Gueziec, Andre, et al. "Cutting and Stitching: Converting Sets of Polygons to Manifold Surfaces." IEEE Transactions on Visualization and Computer Graphics 7.2 (2001): 136-151. Print.
Haines, Eric. "An Introductory Tour of Interactive Rendering." IEEE Computer Graphics and Applications 26.1 (2006): 76-87. ACM Portal. Web. Jun. 20, 2010. <http://portal.acm.org>.
Hardt, Stephen, and Seth J. Teller. "High-Fidelity Radiosity Rendering at Interactive Rates." Proceedings of the Eurographics Work-

(56) References Cited

OTHER PUBLICATIONS shop on Rendering Techniques '96 . London: Springer-Verlag, 1996. N. pag. ACM Portal. Web. Jun. 29, 2010. <http://portal.acm.org>.

Haumont, D., O. Makinen, and S. Nirenstein. "A Low Dimensional Framework for Exact Polygon-to-Polygon Occlusion Queries." Proceedings of the Eurographics Symposium on Rendering. Ed. Kavita Bala and Philip Dutre. N.p.: n.p., 2005. N. pag. Print.

Havemann, Sven, and Deiter W. Fellner. Generative Mesh Modeling. Braunschweig: U of of Technology Muhlenpfordtstr, 2003. Print.

Heckbert, Paul S. "Discontinuity Meshing for Radiosity." Eurographics '92. N.p.: n.p., 1992. 203-16. Print.

Hedley, David. Discontinuity Meshing for Complex Environments. Bristol: U of Bristol, 1998. ACM Portal. Web. Jun. 27, 2010. <http://portal.acm.org>.

Hertzmann, Aaron, and Denis Zorin. "Illustrating Smooth Surfaces." Proceedings of the 27th Annual Conference on Computer Graphics and Interactive Techniques. New York: ACM Press/Wesley Publishing Co., 2000. 517-26. ACM Portal. Web. Jun. 29, 2010. <http://portal.acm.org>.

Hey, Heinrich, and Werner Purgathofer. "Occlusion Culling Methods." Paper presented at Eurographics 2001. Print.

Hoffmann, Christoph M. "The Problems of Accuracy and Robustness in Geometric Computation." IEEE Transactions on Visualization and Computer Graphics (Mar. 1989): 31-41. Print.

Hoffmann, Christoph M. Robustness in Geometric Computations. N.p.: n.p., 2001. Print.

Hosseini, Mojtaba, and Nicolas D. Georganas. "MPEG-4 BIFS Streaming of Large Virtual Environments and their Animation on the Web." Proceedings of the Seventh International Conference on 3D Web Technology . Proc. of 3D Technologies for the World Wide Web conference, Tempe, AZ, 2002. New York: ACM, 2002. 19-25. ACM Portal. Web. Jun. 20, 2010. <http://portal.acm.org>.

Hubbard, Philip M. Constructive Solid Geometry for Triangulated Polyhedra. Providence: Brown University, 1990. Print.

Hudson, T., et al. "Accelerated Occlusion Culling using Shadow Frusta." Proceedings of the Thirteenth Annual Symposium on Computational Geometry . New York: ACM, 1997. 1-10. ACM Portal. Web. Jun. 19, 2010. <http://portal.acm.org>.

Keyser, John, et al. "ESOLID—A System for Exact Boundary Evaluation." Paper presented at Proceedings of the Seventh ACM Symposium on Solid Modeling and Applications, 2002, Saarbrücken, Germany. ACM Symposium on Solid and Physical Modeling. Web. May 23, 2010.

Kirsanov, D., P. V. Sander, and S. J. Gortler. "Simple Silhouettes for Complex Surfaces." ACM International Conference Proceeding Series. Proc. of the 2003 Eurographics/SIGGRAPH Symposium on Geometry Processing. vol. 43. Aire-la-Ville: Eurographics Association, 2003. 102-6. ACM Portal. Web. Jun. 17, 2010. <http://portal.acm.org>.

Kleinberg, Jon, and Eva Tardos. "Algorithm Design." N.d. PDF file. Copyright 2005.

Klosowski, James T., and Claudio T. Silva. "Efficient Conservative Visibility Culling Using the Prioritized-Layered Projection Algorithm." IEEE Transactions on Visualization and Computer Graphics 7.4 (2001): 365-79. ACM Portal. Web. Jun. 9, 2010. <http://portal.acm.org>.

Koltun, Vladen, Yiorgos Chrysanthou, and Daniel Cohen-Or. "Virtual Occluders: An Efficient Intermediate PVS Representation." Proceedings of the Eurographics Workshop on Rendering Techniques 2000. London: Springer-Verlag, 2000. 59-70. ACM Portal. Web. Jun. 19, 2010. <http://portal.acm.org>.

Koltun, Vladlen, Yiorgos Chrysanthou, and Daniel Cohen-Or. "Hardware-Accelerated from-Region Visibility Using a Dual Ray Space." Proceedings of the 12th Eurographics Workshop on Rendering Techniques . London: Springer-Verlag, 2001. 205-16. ACM Portal. Web. Jun. 19, 2010. <http://portal.acm.org>.

Krishnan, Shankar. "Efficient and Accurate Boundary Evaluation Algorithms for Sculptured Solids." Diss. U of North Carolina at Chapel Hill, 1997. Print.

Krishnan, Shankar, and Dinesh Manocha. Global Visibility and Hidden Surface Removal Algorithms for Free Form Surfaces. Chapel Hill: U of North Carolina at Chapel Hill, 1994. Print.

Laidlaw, David H., W. Benjamin Trumbore, and John F. Hughes. "Constructive Solid Geometry for Polyhedral Objects." ACM SIGGRAPH Computer Graphics 20.4 (1986): 161-170. ACM Portal. Web. May 31, 2010. <http://portal.acm.org>.

Laine, Samuli. "A General Algorithm for Output-Sensitive Visibility Preprocessing." Proceedings of the 2005 Symposium on Interactive 3D Graphics and Games. New York: ACM, 2005. 31-40. ACM Portal. Web. Jun. 21, 2010. <http://portal.acm.org>.

Laurentini, Aldo. "The Visual Hull Concept for Silhouette-Based Image Understanding." IEEE Transactions on Pattern Analysis and Machine Intelligence 16.2 (1994): 150-62. ACM Portal. Web. Jun. 27, 2010. <http://portal.acm.org>.

Leyvand, Tommer, Olga Sorkine, and Daniel Cohen-Or. "Ray Space Factorization for From-Region Visibility." ACM SIGGRAPH 2003 Papers. Proc. of International Conference on Computer Graphics and Interactive Techniques, San Diego, CA, 2003. New York: ACM, 2003. 595-604. ACM Portal. Web. Jun. 29, 2010. <http://portal.acm.org>.

Lim, Hong Lip. "Toward a Fuzzy Hidden Surface Algorithm." Proceedings of the 10th International Conference of the Computer Graphics Society on Visual computing: Integrating Computer Graphics with Computer Vision: Integrating Computer Graphics with Computer Vision . New York: Springer-Verlag New York, Inc, 1992. 621-35. ACM Portal. Web. Jun. 8, 2010. <http://portal.acm.org>.

Lischinski, Dani, Filippo Tampieri, and Donald P. Greenberg. "A Discontinuity Meshing Algorithm for Accurate Radiosity." IEEE Computer Graphics and Applications 12.6 (1997): 25-39. Print.

Lorensen, William E., and Harvey E. Cline. "Marching Cubes: A High Resolution 3D Surface Construction Algorithm." ACM SIGGRAPH Computer Graphics 21.4 (1987): 163-69. ACM Portal. Web. Jun. 20, 2010. <http://portal.acm.org>.

Luebke, David. Collection of various lecture slides. N.d. Microsoft PowerPoint file. (Last printed Jul. 27, 1998).

Luebke, David, and Chris Georges. "Portals and Mirrors: Simple, Fast Evaluation of Potentially Visible Sets." Proceedings of the 1995 Symposium on Interactive 3D Graphics . Proc. of Symposium on Interactive 3D Graphics, 1995, Monterey, CA. New York: ACM, 1995. N. pag. ACM Portal. Web. Jun. 9, 2010. <http://portal.acm.org>.

Luka, Peter. "Generalized Conservative Visibility Algorithms." May 30, 2003. MS. Massachusetts Institute of Technology, Cambridge.

Mantyla, Martti. "Boolean Operations of 2-Manifolds through Vertex Neighborhood Classification." ACM Transactions on Graphics 5.1 (1986): 1-29. ACM Portal. Web. May 31, 2010. <http://portal.acm.org>.

Mattausch, Oliver, Jiri Bittner, and Michael Wimmer. "CHC++: Coherent Hierarchical Culling Revisited." Eurographics 2008. Ed. G. Drettakis and R. Scopigno. vol. 27. N.p.: Blackwell Publishing, 2008. 221-30. Print.

McKenna, Michael. "Worst-Case Optimal Hidden-Surface Removal." ACM Transactions on Graphics (TOG) 6.1 (1987): 19-28. ACM Portal. Web. Jun. 29, 2010. <http://portal.acm.org>.

Meyer, Tom. "Introduction to Time-Critical Scheduling." Oct. 5, 1995. PostScript file.

Mora, F., L. Aveneau, and M. Meriaux. "Coherent and Exact Polygon-to-Polygon Visibility." Journal of WSCG (Jan.-Feb. 2005): n. pag. Print.

Moreira, Fabio O., Joao Comba, and Carla Maria Dal Sasso Freitas. "Smart Visible Sets for Networked Virtual Environments." Proceedings of the 15th Brazilian Symposium on Computer Graphics and Image Processing . Washington, DC: IEEE Computer Society, 2002. 373-80. ACM Portal. Web. Jun. 20, 2010. <http://portal.acm.org>.

(56) References Cited

OTHER PUBLICATIONS

Mount, David M. "CMSC 754 Computational Geometry." Fall 2002. U of Maryland Dept. of Computer Science, College Park. CMSC 754 Computational Geometry. Web. May 31, 2010. <http://www.cs.umd.edu/~mount//>.
Myllarniemi, Varvana. "Dynamic Scene Occlusion Culling." Paper presented at Computer Graphics Seminar, Spring 2003. Print.
Naylor, Bruce F. "Partitioning Tree Image Representation and Generation from 3D Geometric Models." Proceedings of the Conference on Graphics Interface '92 . San Francisco: Morgan Kaufmann Publishers, Inc., 1992. 201-12. ACM Portal. Web. Jun. 20, 2010. <http://portal.acm.org>.
Nehab, Diego, Joshua Barczak, and Pedro V. Sander. "Triangle Order Optimization for Graphics Hardware Computation Culling." Proceedings of the 2006 Symposium on Interactive 3D Graphics and Games . New York: ACM, 2006. 207-11. ACM Portal. Web. Jun. 30, 2010. <http://portal.acm.org>.
Nirenstein, S., E. Blake, and J. Gain. "Exact From-Region Visibility Culling." Proceedings of the 13th Eurographics Workshop on Rendering. Proc. of ACM International Conference Proceeding Series, Pisa, Italy, 2002. vol. 28. Aire-la-Ville: Eurographics Association, 2002. 191-202. ACM Portal. Web. Jun. 24, 2010. <http://portal.acm.org>.
Nishita, Tomoyuki, Isao Okamura, and Eihachiro Nakamae. "Shading Models for Point and Linear Sources." ACM Transactions on Graphics (TOG) 4.2 (1985): 124-46. ACM Portal. Web. Jun. 29, 2010. <http://portal.acm.org>.
"NVIDIA GPU Programming Guide." N.d. PDF file. (Created Oct. 12, 2007).
Panne, Michiel Van de, and A. James Stewart. "Effective Compression Techniques for Precomputed Visibility." Paper presented at Eurographics 1999. Print.
Petitjean, Sylvain. "A Computational Geometric Approach to Visual Hulls." International Journal of Computational Geometry and Applications 8.4 (1998): 407-36. Print.
Plantinga, Harry. "Conservative Visibility Preprocessing for Efficient Walkthroughs of 3D Scenes." Proceedings of Graphics Interface 93. Toronto: Canadian Information Processing Society, 1993. 166-73. Print.
Plantinga, Harry, and Charles R. Dyer. "Visibility, Occlusion, and the Aspect Graph." International Journal of Computer Vision 5.2 (1990): 137-60. ACM Portal. Web. Jun. 29, 2010. <http://portal.acm.org>.
Poulin, Pierre, and John Amanatides. "Shading and Shadowing with Linear Light Sources." Paper presented at Eurographics 90. Print. Comput. & Graphics vol. 15, No. 2, pp. 259-265. 1991. Printed in Great Britain.
Rege, Ashu. "Occlusion (HP and NV Extensions)." N.d. Microsoft PowerPoint file. (Created Sep. 25, 2013).
Requicha, Aristides A. G., and Herbert B. Voelcker. "Boolean Operations in Solid Modelling: Boundary Evaluation and Merging Algorithms." File last modified on Jan. 1984. U of Rochester Coll of Engineering and Applied Science. UR Research. Web. May 31, 2010. <https://urresearch.rochester.edu/action?institutionalItemId=990>.
Rusinkiewicz, Szymon, and Marc Levoy. "Streaming QSplat: A Viewer for Networked Visualization of Large, Dense Models." Proceedings of the 2001 Symposium on Interactive 3D Graphics . New York: ACM, 2001. 63-8. ACM Portal. Web. Jun. 20, 2010. <http://portal.acm.org>.
Samet, Hanan. "Spatial Data Structures." Modern Database Systems: The Object Model, Interoperability, and Beyond. Reading: Addison Wesley/Press, 1995. N. pag. Print.
Sander, Pedro V., et al. "Silhouette Clipping." Proceedings of the 27th Annual Conference on Computer Graphics and Interactive Techniques. Proc. of International Conference on Computer Graphics and Interactive Techniques, 2000 . New York: ACM Press/Wesley, 2000. 327-34. ACM Portal. Web. Jun. 19, 2010. <http://portal.acm.org>.
Saona-Vasquez, Carlos, Isabel Navazo, and Pere Brunet. "Data Structures and Algorithms for Navigation in Highly Polygon-Populated Scenes." N.d. PDF file. (Created Nov. 7, 2007).
Saona-Vasquez, Carlos, Isabel Navazo, and Pere Brunet. "The Visibility Octree. A Data Structure for 3D Navigation." Computers & Graphics 23.5 (1999): 635-43. Print.
Schaufler, Gernot, et al. "Conservative Volumetric Visibility with Occluder Fusion." Proceedings of the 27th Annual Conference on Computer Graphics and Interactive Techniques. New York: ACM Press/Wesley Publishing Co., 2000. 229-38. ACM Portal. Web. Jun. 27, 2010. <http://portal.acm.org>.
Schrocker, Gerald. "Visibility Culling for Game Applications." Diss. Graz U of Technology, 2001. Print.
Seidel, Raimund. "Small-Dimensional Linear Programming and Convex Hulls Made Easy." Discrete & Computational Geometry 6.5 (1991): 423-434. ACM Portal. Web. May 31, 2010. <http://portal.acm.org>.
Sharman, James. "The Marching Cubes Algorithm." N.d. HTML file. (Created Sep. 11, 2013).
Sigueira, Marcelo, et al. "A New Construction of Smooth Surfaces from Triangle Meshes Using Parametric Pseudo-Manifolds." Computers and Graphics 33.3 (2009): 331-40. ACM Portal. Web. Jun. 17, 2010. <http://portal.acm.org>.
Soler, Cyril, and Francois X. Sillion. "Fast Calculation of Soft Shadow Textures Using Convolution." Proceedings of the 25th Annual Conference on Computer Graphics and Interactive Techniques. Proc. of International Conference on Computer Graphics and Interactive Techniques. New York: ACM, 1998. 321-32. ACM Portal. Web. Jun. 8, 2010. <http://portal.acm.org>.
Staneker, D. "An Occlusion Culling Toolkit for OpenSG Plus." Paper presented at OpenSG Symposium, 2003. PDF file. OpenSG Symposium (2003).
Stewart, A. James, and Sherif Ghali. "Fast Computation of Shadow Boundaries Using Spacial Coherence and Backprojections." Proceedings of the 21st Annual Conference on Computer Graphics and Interactive Techniques. New York: ACM, 1994. N. pag. ACM Portal. Web. Jun. 29. 2010. <http://portal.acm.org>.
Takusagawa, Ken. "Representing Smooth Surfaces." Oct. 23, 2001. HTML file.
Teller, Seth, and John Alex. Frustum Casting for Progressive, Interactive Rendering. Computer Graphics Group Publications. Massachusetts Institute of Technology, Jan. 1998. Web. Jun. 9, 2010. <http://groups.csail.mit.edu//.html#Technical_Reports>.
Teller, Seth J. "Computing the Antipenumbra of an Area Light Source." ACM SIGGRAPH Computer Graphics 26.2 (1992): 139-48. ACM Portal. Web. Jun. 29, 2010. <http://portal.acm.org>.
Teller, Seth J. "Computing the Antipenumbra of an Area Light Source." 1992. PDF file.
Teller, Seth J. Visibility Computations in Densely Occluded Polyhedral Environments. Diss. U of California at Berkeley, 1992. Berkeley: U of California at Berkeley, 1992. GAX93-30757. ACM Portal. Web. Jun. 29, 2010. <http://portal.acm.org>.
Teller, Seth J., and Pat Hanrahan. "Global Visibility Algorithms for Illumination Computations." Proceedings of the 20th Annual Conference on Computer Graphics and Interactive Techniques . New York: ACM, 1993. 239-46. ACM Portal. Web. Jun. 29, 2010. <http://portal.acm.org>.
Teller, Seth J., and Michael E. Hohmeyer. Stabbing Oriented Convex Polygons in Randomized O(n2) Time. ACM Portal. N.p., n.d. Web. Jun. 29, 2010. <http://portal.acm.org>.
Thibault, William C., and Bruce F. Naylor. "Set Operations on Polyhedra Using Binary Space Partitioning Trees." ACM SIGGRAPH Computer Graphics 21.4 (1987): 153-162. ACM Portal. Web. May 31, 2010. <http://portal.acm.org>.
Vlachos, Alex. "Preparing Sushi: How Hardware Guys Write a 3D Graphics Engine." 2001. PDF file.
Wald, Ingo, Andreas Dietrich, and Philipp Slusallek. "An Interactive Out-of-Core Rendering Framework for Visualizing Massively Complex Models." ACM SIGGRAPH 2005 Courses . Proc. of International Conference on Computer Graphics and Interactive Techniques . New York: ACM, 2005. N. pag. ACM Portal. Web. Jun. 20, 2010. <http://portal.acm.org>.

(56) References Cited

OTHER PUBLICATIONS

Wang, Yigang, Hujun Bao, and Qunsheng Peng. "Accelerated Walkthroughs of Virtual Environments Based on Visibility Preprocessing and Simplification." Computer Graphics Forum 17.3 (1998): 187-94. Print.
Wang, Yusu, Pankaj K. Agarwal, and Sariel Har-Peled. "Occlusion Culling for Fast Walkthrough in Urban Areas." Eurographics 2001. N.p.: n.p., 2001. N. pag. Print.
Weiler, Kevin, and Peter Atherton. "Hidden Surface Removal using Polygon Area Sorting." Proceedings of the 4th Annual Conference on Computer Graphics and Interactive Techniques. New York: ACM, 1977. 214-22. ACM Portal. Web. Jun. 30, 2010. <http://portal.acm.org>.
Weiler, Kevin, and Peter Atherton. Slides explaining polygon clipping. N.d. PDF file. (Created Oct. 23, 2006).
Wloka, Matthias. "Batch, Batch, Batch: What Does it Really Mean?" N.d. Microsoft PowerPoint file. (Created Mar. 12, 2003).
Wonka, Peter. "Occluder Shadows for Fast Walkthroughs of Urban Environments." Eurographics 1999. vol. 18, No. 3. Oxford: Blackwell Publishers, 1999. N. pag. Print.
Wonka, Peter, Michael Wimmer, and Dieter Schmalstieg. "Visibility Preprocessing with Occluder Fusion for Urban Walkthroughs." Proceedings of the Eurographics Workshop on Rendering Techniques 2000. London: Springer-Verlag, 2000. 71-82. ACM Portal. Web. Jun. 8, 2010. <http://portal.acm.org>.
Wonka, Peter, Michael Wimmer, and Francois X. Sillion. "Instant Visibility." Eurographics 2001. Ed. A. Chalmers and T.-M. Rhyne. vol. 20. Oxford: Blackwell Publishers, 2001. N. pag. Print.
Wood, Zoe Justine. "Computational Topology Algorithms for Discrete 2-Manifolds." Diss. California Institute of Technology, 2003. Print.
Worrall, Adam. "Dynamic Discontinuity Meshing." Diss. U of Bristol, 1998. Print.
Yoon, Sung-Eui, Brian Salomon, and Dinesh Manocha. "Interactive View-Dependent Rendering with Conservative Occlusion Culling in Complex Environments." Proceedings of the 14th IEEE Visualization 2003 (VIS'03). Washington, DC: IEEE Computer Society, 2003. N. pag. ACM Portal. Web. Jun. 9, 2010. <http://portal.acm.org>.
Zhang, Hongxin, and Jieqing Feng. "Preliminary Mathematics of Geometric Modeling (2)." Nov. 23, 2006. PDF file.
Zheng, Wenting, et al. "Rendering of Virtual Environments Based on Polygonal & Point-Based Models." Proceedings of the ACM Symposium on Virtual Reality Software and Technology. New York: ACM, 2002. 25-32. ACM Portal. Web. Jun. 20, 2010. <http://portal.acm.org>.
Zhou, Kaichi, et al. "Visibility-Driven Mesh Analysis and Visualization through Graph Cuts." IEEE Transactions on Visualization and Computer Graphics 14.6 (2008): 1667-74. Print.
Jean-Eudes Marvie, et al., "Remote Interactive Walkthrough of City Models", IEEE 11TH Pacific Conference on Computer Graphics and Applications, 2003, 5 pages.
Shachar Fleishman, et al., "Automatic Camera Placement for Image-Based Modeling", Blackwell Publishers, Computer Graphics Forum, vol. 19, No. 2, 2000, 9 pages.
Frédo Durand, "A Multidisciplinary Survey of Visibility", ACM SIGGRAPH Course Notes on Visibility, 2000, 146 pages.
Combined Office Action and Search Report dated Oct. 29, 2015 in Chinese Patent Application No. 201180042082.0 (with English language translation).
Combined Chinese Office Action and Search Report dated Dec. 19, 2014 in Patent Application No. 201180042082.0 (with English language translation).
El-Sana, J., et al., "Integrating Occlusion Culling with View-Dependent Rendering," Presented at IEEE-Visualization 2001, Total 9 pages, (Oct. 26, 2001).
Lloyd, B. et al., "Horizon Occlusion Culling for Real-time Rendering of Hierarchical Terrains," IEEE Visualization 2002, Total 7 pages, (Nov. 1, 2002).
Diepstraten, J. et al., "Remote Line Rendering for Mobile Devices," Computer Graphics International, 2004 Proceedings, Total 8 pages, (Jun. 19, 2004).
International Search Report dated Jan. 5, 2012 in PCT/US11/42309 Filed Jun. 29, 2011.

\* cited by examiner

VISIBILITY EVENT NAVIGATION METHOD AND SYSTEM

FIELD

The present invention relates generally to navigation using 3D representations of a given space to be navigated, and more particularly to a method and system for streaming visibility event data to navigating vehicles (on land, sea, air, or space), and using the visibility event data in 3D map-matching and other computer vision navigation methods.

BACKGROUND

The "background" description provided herein is for the purpose of generally presenting the context of the disclosure. Work of the presently named inventor, to the extent it is described in this background section, as well as aspects of the description which may not otherwise qualify as prior art at the time of filing, are neither expressly or impliedly admitted as prior art against the present disclosure.

Precision navigation in obstacle-strewn environments such as the urban canyon or indoors is challenging. Typically GPS does not provide the precision required to navigate in obstacle rich environments. Also GPS reception requires line of sight access to at least four satellites, which is often not available in the urban canyon because of occlusion of the sky by buildings. Additionally, GPS radio signals are relatively weak, and can be jammed or spoofed (replaced by a false data stream that can mislead the targeted navigational system).

Higher-power radio navigation methods such as eLORAN may be less susceptible to jamming near the transmitter. Otherwise these methods inherit most of the vulnerabilities of GPS radio navigation, including susceptibility to denial of service by attack on the fixed transmitters. The precision of eLORAN localization is significantly less than GPS, and the global availability of eLORAN service has been significantly limited by the recent decision by the United Kingdom to discontinue eLORAN service in Europe.

3D map-matching is a navigational basis that is orthogonal to GPS and eLORAN navigation and consequently does not suffer from the same limitations and vulnerabilities. Early 2.5D map matching systems such as TERCOM (Terrain Contour Matching), were effectively employed in cruise missile navigation prior to GPS. The ability to pre-acquire detailed 3D environmental data has increased exponentially since the time of TERCOM. Moreover, commodity sensors are now available which generate real-time point-clouds that could potentially be matched to the pre-acquired 3D environmental data to provide rapid, precise localization in many GPS denied environments.

However, two problems have slowed the general adoption of efficient 3D map-match solutions. First, because the 3D environmental data sets are so large, it can be difficult to transmit and maintain them over existing networks using conventional data delivery approaches. Second, processing of these massive 3D datasets by 3D map-matching algorithms can be very inefficient because the matching algorithm is typically forced to process a large amount of occluded data that is irrelevant to the immediate 3D map-match localization solution. This is especially true in densely occluded natural terrains, indoors, or within the urban canyon, where buildings make most of the surfaces of the environment occluded from any small region.

SUMMARY

In an exemplary aspect, a method of visibility event navigation includes one or more visibility event packets located at a server, the one or more visibility event packets including visibility event packet information representing 3D surface elements of a geospatial model that are occluded from a first viewcell and not occluded from a second viewcell, the first and second viewcells representing spatial regions of a navigational route within a real environment modeled by the geospatial model. The method of visibility event navigation also includes receiving, via processing circuitry of a client device, at least one visibility event packet of the one or more visibility event packets from the server, detecting, via the circuitry, surface information representing one or more visible surfaces of the real environment at a sensor in communication with the client device, and calculating, via the circuitry, at least one position of the client device in the real environment by matching the surface information to the visibility event packet information corresponding to a first visibility event packet of the one or more visibility event packets. The method of visibility event navigation further includes, transmitting, via the circuitry, the at least one position from the client device to the server, and receiving, via the circuitry, at least one second visibility event packet of the one or more visibility event packets when the at least one position is within the navigational route at the client device from the server.

In some exemplary aspects, a method of visibility event navigation includes one or more visibility event packets located at a server, including information representing 3D surface elements of a geospatial model that are occluded from a first viewcell and not occluded from a second viewcell, the first and second viewcells representing spatial regions of a navigational route within a real environment modeled by the geospatial model. The method of visibility event navigation also includes prefetching, via processing circuitry of the server, a first visibility event packet of the one or more visibility event packets to a client device, receiving, via the circuitry, at least one position of the client device in the real environment at the server, and transmitting, via the circuitry, a second visibility event packet of the one or more visibility event packets to the client device when the at least one position is within the navigational route.

In certain exemplary aspects, a method of visibility event navigation prefetch includes at least one partial visibility event packet including a subset of a complete visibility event packet, the complete visibility event packet including information representing 3D surface elements of a geospatial model occluded from a first viewcell and not occluded from a second viewcell, the first and second viewcells representing spatial regions of a navigational route within a real environment modeled by the geospatial model. The method of visibility event navigation prefetch further includes receiving, via processing circuitry of a server, information at the server from a client device representing an orientation of a sensor located at the client device, the sensor acquiring information representing the visible surfaces of the real environment, and transmitting, via the circuitry, the at least one partial visibility event packet from the server to the client device, wherein the at least one partial visibility event packet intersects a maximal view frustum including a volume of space intersected by the view frustum of the sensor during movement of the client device in the second viewcell.

In some exemplary aspects, a method of visibility event navigation includes at least one partial visibility event packet located at a server, the at least one partial visibility event packet including a subset of a complete visibility event packet, the complete visibility event packet including visibility event packet information representing 3D surface elements of a geospatial model occluded from a first viewcell and not occluded from a second viewcell, the first and second viewcells representing spatial regions of a navigational route within a real environment modeled by the geospatial model. The method of visibility event navigation further includes transmitting, via processing circuitry of a client device, surface information from the client device to the server corresponding to the orientation of a sensor located at the client device, the surface information representing visible surfaces of the real environment, and receiving, via the circuitry, the at least one partial visibility event packet at the client device from the server including a subset of the visibility event packet information that intersects a maximal view frustum, wherein the maximal view frustum includes a volume of space intersected by a view frustum of the sensor during movement of the client device in the second viewcell.

In some exemplary aspects, a method of visibility event navigation includes a first visibility event packet of one or more visibility event packets from a server, the one or more visibility event packets including visibility event packet information representing 3D surface elements of a geospatial model that are occluded from a first viewcell and not occluded from a second viewcell, the first and second viewcells representing spatial regions of a navigational route within a real environment modeled by the geospatial model. The method of visibility event navigation also includes, detecting, via processing circuitry of a first client device of a plurality of client devices, surface information representing visible surfaces of the real environment at a sensor in communication with the first client device of the plurality of client device, calculating, via the circuitry, at least one position of the first client device of the plurality of client devices in the real environment by matching the surface information to the visibility event packet information, and transmitting, via the circuitry, the at least one position from the first client device of the plurality of client devices to the server. The method of visibility event navigation further includes receiving, via the circuitry, at least one second visibility event packet of the one or more visibility event packets at the first client device of the plurality of client devices from the server when the at least one position is within the navigational route, detecting, via the circuitry, position information representing the position of at least one second client device of the one or more client devices in the real environment at the sensor, and transmitting, via the circuitry, the position information from the first client device of the plurality of client devices to the server.

In certain exemplary aspects, a method of visibility event navigation prefetch includes a first visibility event packet of one or more visibility event packets, the one or more visibility event packets including visibility event packet information representing 3D surface elements of a geospatial model that are occluded from a first viewcell and not occluded from a second viewcell, the first and second viewcells representing spatial regions of a navigational route within a real environment modeled by the geospatial model. The method of visibility event navigation prefetch further includes receiving, via processing circuitry of a server, at least one position of a client device in the real environment at the server from the client device, and transmitting, via the circuitry, a second visibility event packet of the one or more visibility event packets when the at least one position of the client device is within the navigational route and a fee has been paid by an operator of the client device.

In some exemplary aspects, a method of visibility event navigation includes one or more visibility event packets located at a server, the one or more visibility event packets including visibility event packet information representing 3D surface elements of a geospatial model that are occluded from a first viewcell and not occluded from a second viewcell, the first and second viewcells representing spatial regions of a navigational route within a real environment modeled by the geospatial model. The method of visibility event navigation also includes receiving, via processing circuitry of a client device, at least one visibility event packet of the one or more visibility event packets from the server, detecting, via processing circuitry of the client device, surface information representing one or more visible surfaces of the real environment at a sensor in communication with the client device, calculating, via the circuitry, at least one position of the client device in the real environment by matching the surface information to the visibility event packet information corresponding to the first visibility event packet of the one or more visibility event packets, and transmitting, via the circuitry, the at least one position in the real environment from the client device to the server The method of visibility event navigation further includes receiving, via the circuitry, at least one second visibility event packet from the server of the one or more visibility event packets at the client device from the server, calculating, via the circuitry, at least one deviation of the ground-truth 3D structure from the corresponding environment modeled by the geospatial model using the surface information and the visibility event packet information and transmitting, via the circuitry, the at least one deviation from the client device to the server.

In certain exemplary aspects, a visibility event navigation system includes a server and at least one client device located in a real environment and in communication with the server. The at least one client device includes processing circuitry configured to detect surface information representing one or more visible surfaces of the real environment at one or more sensors in communication with the at least one client device, and calculate at least one position of the at least one client device in the real environment by matching the surface information to visibility event packet information including a first visibility event packet of one or more visibility event packets representing 3D surface elements of a geospatial model that are occluded from a first viewcell and not occluded from a second viewcell, the first and second viewcells representing spatial regions of a navigational route within the real environment and modeled by the geospatial model. The processing circuitry is further configured to transmit the at least one position of the client device to the server and receive a second visibility event packet of the one or more visibility event packets from the server when the at least one position is within the navigational route.

The foregoing paragraphs have been provided by way of general introduction, and are not intended to limit the scope of the claims. The described aspects, together with further advantages, will be best understood by reference to the following detailed description taken in conjunction with the accompanying drawings.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION

Figure 1:
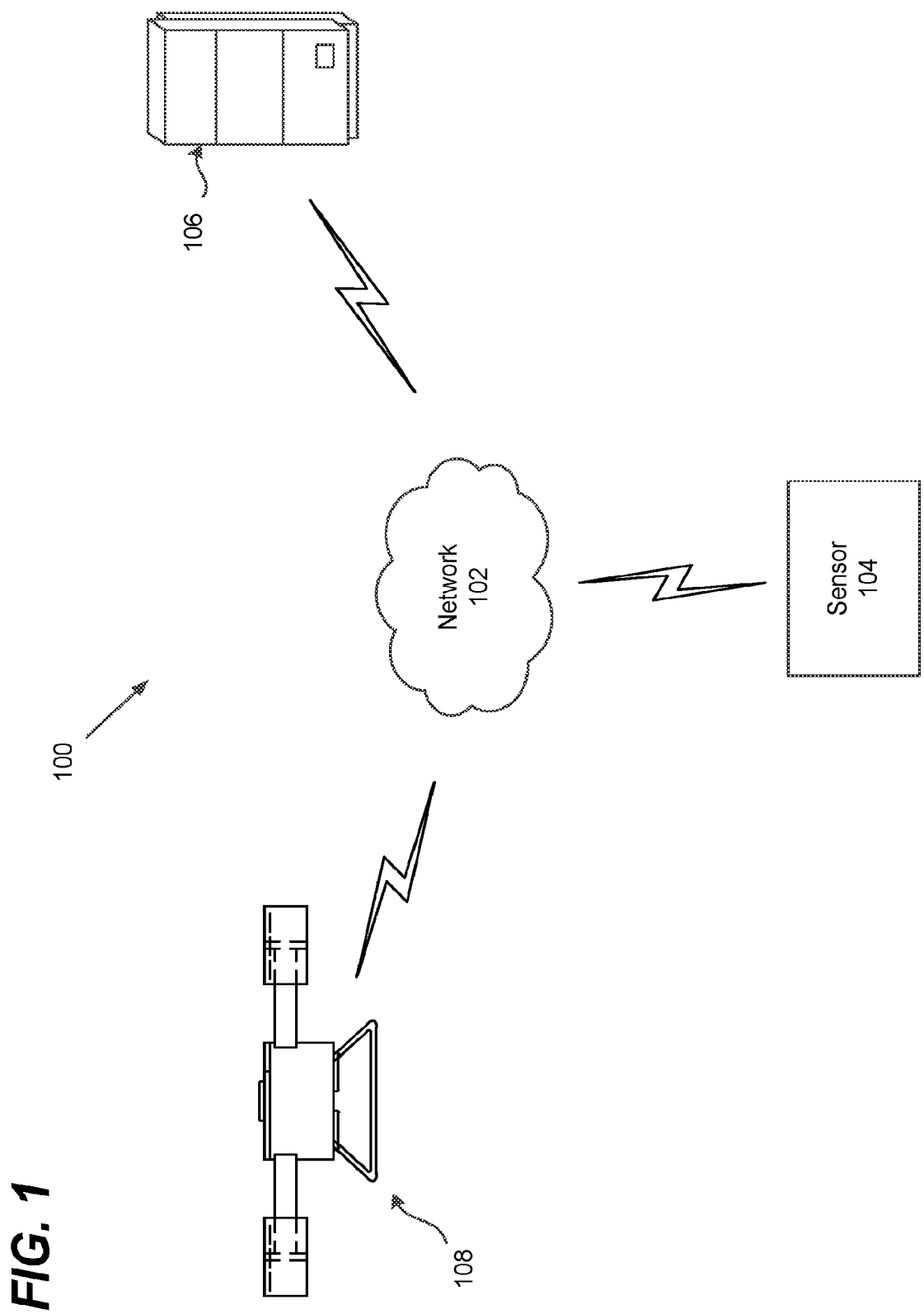
FIG. 1 is an exemplary illustration of a visibility event navigation system, according to certain aspects.

In the drawings, like reference numerals designate identical or corresponding parts throughout the several views. Further, as used herein, the words "a," "an" and the like generally carry a meaning of "one or more," unless stated otherwise.

Furthermore, the terms "approximately," "approximate," "about," and similar terms generally refer to ranges that include the identified value within a margin of 20%, 10%, or preferably 5%, and any values therebetween.

In certain exemplary aspects, there is described a method to deliver and receive navigational data as visibility event packets, wherein the visibility event packets include information representing 3D surface elements of a geospatial model that are occluded from a first viewcell and not occluded from a second viewcell, the first and second viewcells representing spatial regions of a specified navigational route within a real environment modeled by a geospatial model. The specified navigational route can also be referred to as a pursuit route, pursuit route, navigational route, route of navigation, route of navigation, desired route, desired route, specified route, specified route, and the like, as discussed herein. As such, a navigating client device receives at least one visibility event packet from a server.

In some aspects, the navigating client device employs sensors to acquire information representing the surrounding visible surfaces of the real environment. In certain aspects, the data is collected as a 3D point cloud including X axis, Y axis, and Z axis values utilizing LiDAR, SONAR, optical photogrammetric reconstruction, or other sensor means that are known. The 3D surface information of the real environment can be acquired by the sensor and matched to the 3D surface information of at least one visibility event packet delivered from the server to the client device in order to determine the position of the client device in the real environment. In other aspects, the 3D map-matching position determination is used as the sole method of determining position or augmented with other navigational methods such as GPS, eLORAN, inertial navigation, and the like. The 3D map-matching determination can be configured to employ matching of directly/indirectly acquired point cloud data to the 3D modeled data. In some aspects, the 3D map-matching can also compare geometric or visual "features" acquired from the environment to the transmitted 3D data. In certain aspects, the transmitted visibility event packets include 3D surface model information representing the real environment as polygons, procedural surfaces, or other representations. Instances in which the visibility event packets employ procedural representation of the surfaces of the modeled environment can include the methods of employing procedural surface representations in visibility event packets, to reduce the transmission bandwidth required to send the navigational data.

In some exemplary aspects, the visibility event navigation system employs 3D map-matching of ground-truth sensor data to visibility event packet model data to determine a position and an orientation of a client device in a real environment. In exemplary aspects, the visibility event packets provide a 3D representation that provides accelerated 3D map-matching in comparison to systems which deliver 3D model data using a conventional proximity-based streaming. As such, proximity based streaming delivers many model surfaces that are occluded and therefore irrelevant to the 3D map-match process, which generally must only match unoccluded ground truth sensor data to the model data. Additionally, proximity based streaming methods can have higher bandwidth requirements, because they deliver a large amount of occluded data that is not relevant for the 3D map-match localization. This additional occluded data delivered by proximity-based streaming methods also tends to make the client-side 3D map-match process less efficient, since it introduces irrelevant data into the 3D map-match execution. In addition to delivering a potentially large amount of occluded model surface information, proximity-based streaming methods can fail to deliver potentially useful, unoccluded model surface data because it is not within the current proximity sphere that the server is using for prefetch. This loss of potentially useful data is exacerbated in densely occluded environments such as cities because the transmission of a large amount of occluded surface model data often causes the system to reduce the proximity sphere in an effort to maintain the stream.

In some exemplary aspects, the visibility event navigation system employs computer vision systems other than conventional 3D map-matching to match ground-truth surfaces or features to visibility event packet model data representing basic surfaces or salient 3D features of the modeled environment.

In some exemplary aspects, the efficient delivery of high-precision, relevant 3D surface model data enables a localization solution that is faster, more efficient, and more precise than simultaneous localization and mapping (SLAM). Pure SLAM solutions do not incorporate prior-knowledge of the environment into their localization solutions but instead depend upon effectively developing the real-time 3D model de novo, in real time. Consequently, pure SLAM is more computationally expensive and less precise than 3D map-matching to prior, processed (e.g., previously geo-registered), and relevant (unoccluded) 3D data delivered by a visibility event navigational data stream. The increased computational efficiency of 3D map-matching compared to SLAM-focused localization can free on board sensor and computational resources to focus on identifying, tracking, and avoiding moving objects in the environment, such as other client devices.

In certain exemplary aspects, visibility event navigation data is compared to an actual ground-truth 3D representation of visible surfaces of an environment in which navigation occurs. The comparison can employ 3D map-matching methods, other surface matching methods, computer vision matching methods, and the like. In some aspects, if the comparison of the ground-truth sensor data and the visibility event navigation data determines that the ground-truth surfaces do not match the delivered visibility event navigation data, then data representing the difference between the streamed visibility event navigation data and the ground truth sensor data is streamed to the visibility event navigation server. In some aspects, the server compares this information suggesting an apparent change in the structure of the 3D environment in a particular region of the model corresponding to the viewcells from which the changed surfaces would be visible. The method enables a maintainable, sustainable, scalable, and deliverable representation of earth's natural and urban environments for the purposes of high-precision navigation.

In some aspects, the primary navigation routes represented by primary visibility event navigation packets delivered from the server are specifically calculated to avoid low-altitude helicopter traffic by incorporating ADS-B (Automated Dependent Surveillance-Broadcast) information into the route planning. The server uses this dynamic information about helicopter and other low altitude aircraft, as well as information about helicopter routes and landing pads, to compute and stream routes for autonomous vehicles that avoid other low altitude aircraft. In certain aspects, the current position of any aircraft being controlled by the as determined using the visibility event navigation system, as well as the planned route could potentially be incorporated into ADS-B system or other commercial systems (e.g. commercial systems such as FOREFLIGHT® or GARMIN-PILOT®), which would make the position of the controlled aircraft available to other aircraft though these networks.

In certain aspects, small unmanned aerial vehicles, such as small drones operating in a commercial application of package delivery, are given visibility event navigational packets corresponding to flight routes that are intended to survey regions for wires, cables, towers, cranes and other hazards to low altitude aircraft such as helicopters. The relevant visibility event navigation data is made available to piloted client devices not being controlled by the visibility event navigation system, for the purpose of obstacle avoidance. By transmitting the position of the piloted client device (as determined by GPS or other navigational means) to the server, the server can then compute real-time collision course and issue proximity or impending collision warnings to the client device. In some aspects, the server streams the relevant visibility event packets so that the computation can be made on board the piloted client device. By prefetching all the visibility event packets required for an intended navigational route, a continuous connection between the client device and the server is unnecessary to provide the collision warning service.

In certain aspects, a server is configured to deliver visibility event packets to certified client devices which present authenticated credentials using a secure process of authentication, such as a cryptographic ticket. The transmission of visibility event packets to certified clients ensures that the client device has met certain requirements for navigating along the intended route. In some aspects, this can allow autonomous navigation in airspace to client devices including operators and airframes that meet specified requirements for safe operation, such as airworthiness.

In some aspects, the visibility event navigational data stream is made available through the provenance of an issuing navigational authority. Additionally, the visibility event navigational data stream is encrypted, authenticated, registered, and transactional. A client device such as an aircraft or vehicle employing the visibility event navigation client system can use onboard sensors to detect uncertified/unregistered objects operating in the vicinity of the certified/registered client device, and to report the location of the intruding object to the server. The implementation of the visibility event navigation system could enhance the ability of the Federal Aviation Administration (FAA), the Department of Homeland Security (DHS), or similar issuing authority to control and monitor low-altitude airspace. As such, a sustainable revenue stream can be generated by the issuing authority operating the visibility event navigation stream through modest, per-trip transaction fees for autonomous or semi-autonomous client devices using the visibility event navigation stream in the controlled airspace.

In certain aspects, the navigating client device receives visibility event packets for the purpose of high-precision navigation within a prescribed flight route. The client device can be required to transmit its location to the server delivering the packets at predetermined intervals. In this instance, the server can be configured to periodically or continuously deliver alternate visibility event packets including visible surfaces that are encoded as visibility event packets and located along one or more flight routes from a current location of the client device to a safe landing zone. In doing so, flight safety can be reinforced by providing data that enhances the ability of the aircraft to make a safe landing at any point in time. In some aspects, the client device is a piloted aircraft, wherein the visibility event data representing an alternate route to one or more safe landing zones is immediately available to the pilot in case of engine failure or other circumstances that necessitate an immediate safe landing. The safe landing zone data is used by the pilot to identify reachable safe landing zones. In other aspects, the client device may be controlled by an autopilot or other system which is instructed to follow one or more of the alternate routes supplied as a visibility event navigational stream to a safe landing zone. The client device may be autonomous or semiautonomous, or have an autonomous navigation system in which the visibility event packets supply information used by 3D map-matching or other computer vision navigation systems that employ a high precision 3D representation of the environment in which the navigation will occur.

In some aspects, a visibility event navigation system includes a command within the client device to follow an alternative navigational route to safe landing in case the client device loses communications with the server. In other aspects, the server can be configured to determine if the location of the client device deviates from the specified flight route, and if the client device is determined to deviate, the server transmits a command to the client device which causes the aircraft to divert to the alternate route described by the alternate route visibility event packets, thus making a safe landing in a predetermined safe landing zone. The alternate route defined by the visibility event navigation packets that the client device navigates along, either from a default on-board instruction or from an instruction explicitly transmitted from the visibility event navigational server, may not necessarily be the closest landing zone. Instead, the alternate route may be selected based on other safety criteria, such as proximity to people, ground vehicles, or proximity to security-sensitive buildings or transportation routes.

In certain aspects, the server delivers visibility event navigation packets to visibility event navigation systems including client devices such as commercial aircraft, package delivery drones, and the like. The visibility event navigation system can deliver visibility event navigation packets from the server to client devices used by law enforcement agencies, for example surveillance drones. In other exemplary aspects, the visibility event navigation system facilitates a dual-use in which commercial aircraft may optionally assist law enforcement agencies by optionally receiving visibility event navigation packets which define a route to an incident of threatened public safety, and optionally receive an instruction to navigate along this route to the incident area.

In certain aspects, the transmission of navigational data as visibility event packets for navigation along a predetermined route includes a method of enhanced predictive prefetching as described in copending parent application Ser. No. 15/013,784. In some aspects, the bandwidth required to stream visibility event navigational packets is reduced when the desired navigational route, on the ground or in the air, is known before packet transmission. As such, prior knowledge of the navigational route improves the efficiency of navigation-driven prefetch of visibility event packets, whether the packets are being delivered for visualization, for example in entertainment or serious visualization applications, or for navigation such as visibility even navigational data for use in 3D map-matching or other robotic vision based navigation systems. In some aspects, the prior knowledge of navigational intent along a specific navigational route limits the number of visibility event packets that must be prefetched, since navigational uncertainty is reduced, and the ability to deterministically, rather than probabilistically, prefetch packets corresponding to viewcell transitions far ahead of the navigating client is increased. In this instance, a deterministic prefetch approach enables efficient streaming of visibility event navigational packets over high latency and low bandwidth networks.

FIG. 1 is an exemplary illustration of a visibility event navigation system 100, according to certain aspects. The visibility navigation system 100 describes a system for transmitting and receiving navigational data as visibility event packets between a client device 108 and a server 106. The visibility event navigation system 100 can include a network 102, a sensor 104, a server 106, and a client device 108. The sensor 104 can be one or more sensors 104 and is connected to the server 106 and the client device 108 via the network 102. The sensor 104 can include a LiDAR sensor, a SONAR sensor, an optical sensor, and the like. In certain aspects, the sensor 104 can be directly connected to the client device 108, as in the case of the sensor 104 being directly employed by the client device 108 for 3D map-matching, computer vision surface matching methods, surface feature matching methods, and the like. In some aspects, the sensor 104 can be utilized by circuitry of the client device 108 to identify and track moving objects in an environment. Further, the sensor 104 can be employed by the client device 108 to acquire information representing visible surfaces of the environment surrounding the client device 108. In certain aspects, the 3D surface information acquired by the sensor 104, via the circuitry of the client device 108, is matched to 3D surface information of a visibility event packet that is delivered from the server 106 to the client device 108 in order to determine the position or location of the client device 108 within the environment.

The server 106 can include one or more servers 106 and is connected to the sensor 104 and the client device 108 via the network 102. The server 106 includes processing circuitry that can be configured to receive position information of the client device 108 from the processing circuitry of the client device 108. In some aspects, the circuitry of the server 106 can be configured to transmit visibility event packets to the client device 108 when the position of the client device 108 is located within a predetermined navigational route. In other aspects, the server 106 can include network nodes that transmit information to one or more client devices 108 at different positions along different navigational routes.

The client device 108 can include one or more client devices 108 and is connected to the sensor 104 and the server 106 via the network 102. The client device 108 can include an autonomous aircraft, a semiautonomous aircraft, a piloted aircraft, an autonomous ground vehicle, a semiautonomous ground vehicle, and the like. The client device 108 includes processing circuitry that can be configured to detect surface information representing visible surfaces of a real environment the client device 108 is located in. In certain aspects, the circuitry of the client device 108 utilizes the sensor 104 to determine the surface information. The circuitry of the client device 108 can also be configured to calculate a position of the client device 108 in the environment by matching the surface information to visibility event packet information corresponding to visibility event packets representing 3D surface elements of a geospatial model that are occluded from a first viewcell and not occluded from a second viewcell, in which the first and second viewcells represent spatial regions of a navigational route with the environment that are modeled by the geospatial mode. In some aspects, the circuitry of the client device 108 can be configured to transmit the position information of the client device 108 to the server 106 and receive visibility event packets from the server 106 when the position of the client device 108 is within the navigational route. In certain aspects of the present disclosure, the processing circuitry of the server 106 can be configured to perform the methods implemented by the processing circuitry of the client device 108, as described herein.

The network 102 can include one or more networks and is connected to the sensor 104, the server 106, and the client device 108. The network 102 can encompass wireless networks such as Wi-Fi, BLUETOOTH, cellular networks including EDGE, 3G and 4G wireless cellular systems, or any other wireless form of communication that is known, and may also encompass wired networks, such as Ethernet.

Figure 2A:
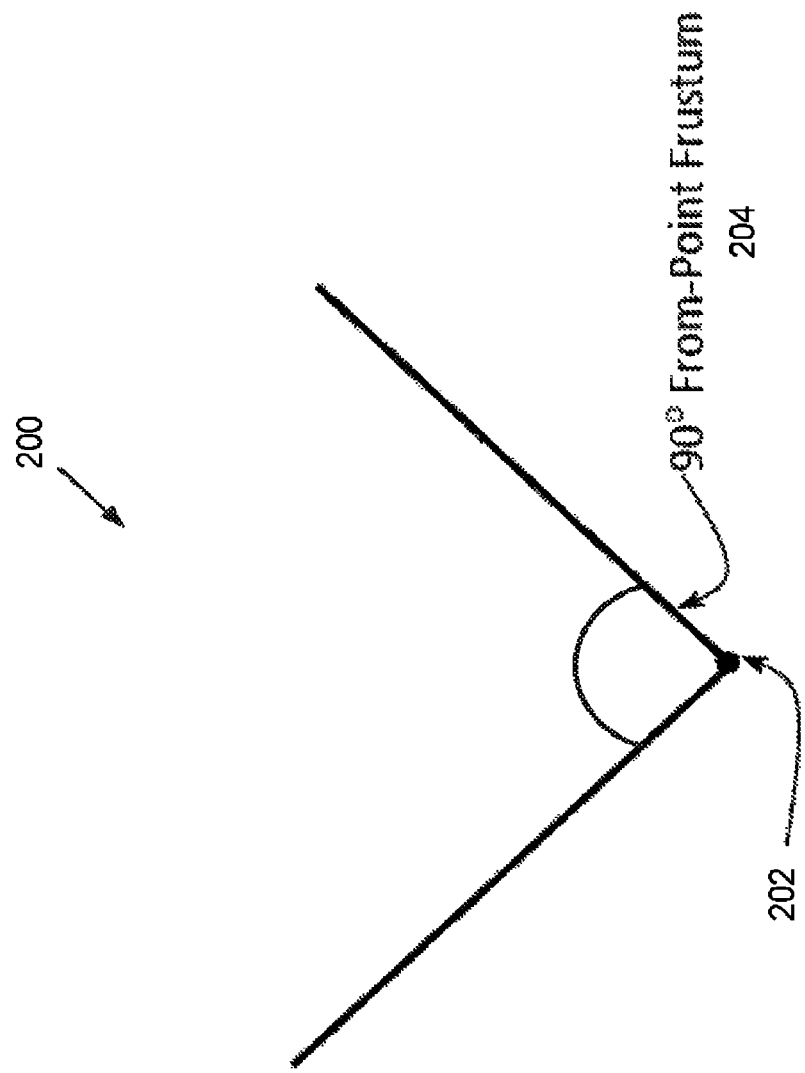
FIG. 2A is an exemplary illustration of an exemplary viewpoint and a corresponding exemplary view frustum having a 90 degree horizontal field of view, according to certain aspects.

FIG. 2A is an exemplary illustration of an exemplary viewpoint and a corresponding exemplary view frustum having a 90 degree horizontal field of view 200, according to certain aspects. In certain aspects of the present disclosure, 3D map-matching, computer-vision based surface methods, feature matching methods, and the like employ 2D and/or 3D scans of a real environment (for example, photographic or LiDAR) via a single scan point. The scan point can also be referred to as viewpoint, as discussed herein. In some aspects, the scanning method used to obtain a representation of the real environment may have a limited directional extent. The directional extent of the scan method can also be referred to as the scan frustum or view frustum, as discussed herein. The average or principal direction of the scan can also be referred to as the view direction vector, as discussed herein. The viewpoint 202 includes a corresponding view frustum 204 that includes a view direction vector for processing visibility event packets. The use of view direction vectors to compute smaller visibility event packets can be useful for streaming a fixed or limited view direction vector in real environments. In some aspects, the visibility event navigation can include acquiring 3D surface information of a real environment, acquired by a sensor 104 in communication with a client device 108, and matching the 3D surface information of at least one visibility event packet to determine the position of the client device 108 in the environment. In the general case, the view direction vector can be pointed in any direction for any viewpoint within any viewcell, corresponding to a view direction vector of a predetermined field of view. For example, FIG. 2A shows a viewpoint 202, and a corresponding view frustum having a 90 degree horizontal field of view 204.

Figure 2B:
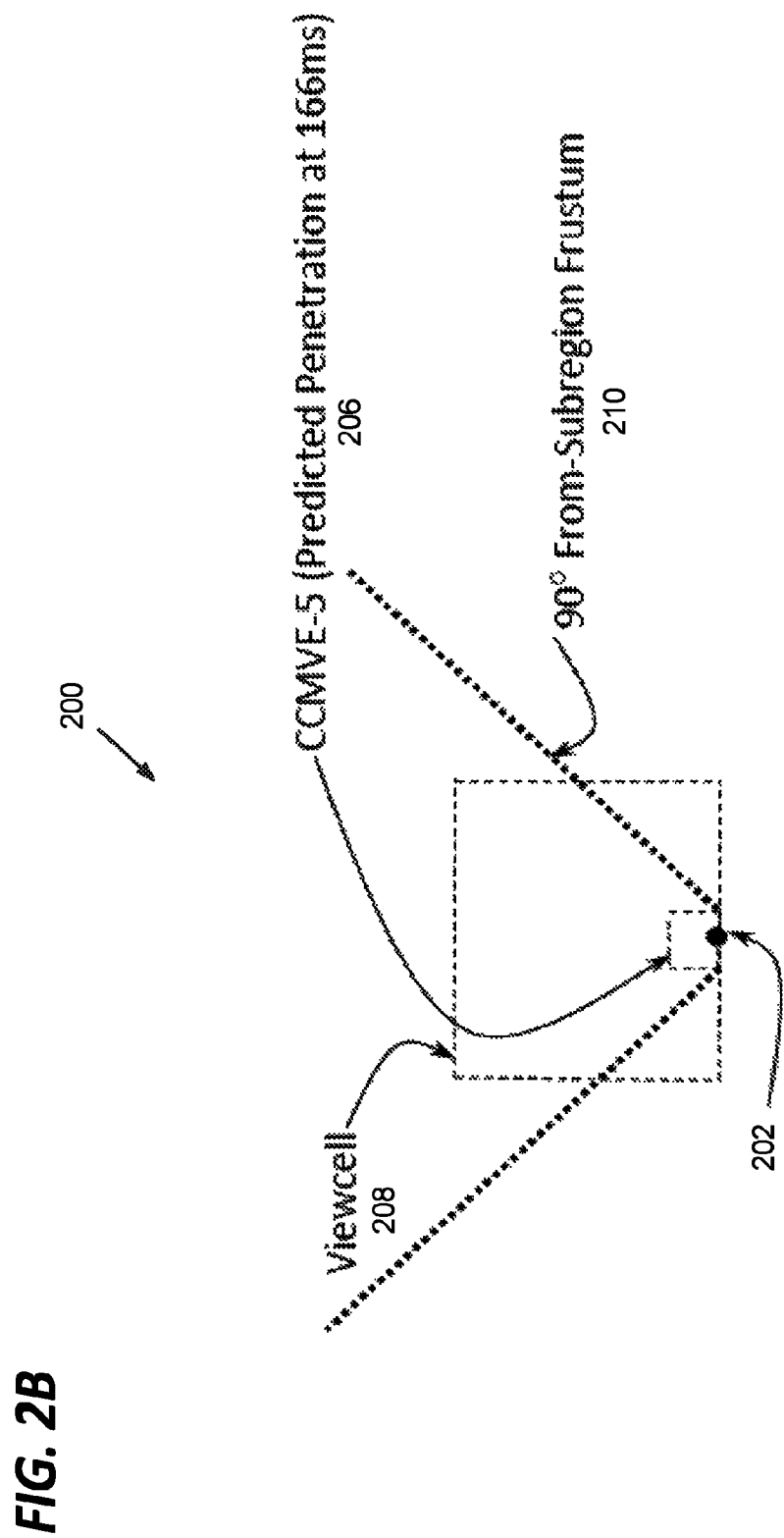
FIG. 2B is an exemplary illustration of a conservative current maximal viewpoint extent (CCMVE) of penetration into a viewcell from a known position after 166 ms of elapsed time using the exemplary view frustum having a 90 degree horizontal field of view, according to certain aspects.

FIG. 2B is an exemplary illustration of a conservative current maximal viewpoint extent (CCMVE) 206 of penetration into a viewcell from a known position after 166 ms of elapsed time using the exemplary view frustum 210 having a 90 degree horizontal field of view 200, according to certain aspects. FIG. 2B shows a top-down view of a 90 degree horizontal field of view frustum 210 enveloping the CCMVE-5 206. FIG. 2B also shows a conservative current maximal viewpoint extent 206, CCMVE-5, of penetration into the viewcell 208 from a known position after 166 ms of elapsed time. The CCMVE-5 206 is determined from a last known position and the maximal linear and angular velocity and acceleration of the viewpoint 202. For example, for a typical 90 degree field of view such as the 90 degree from-point frustum 204 shown in FIG. 2A, rotation rates of the frustum 204 approach 130 to 140 degrees per second. However, a 90 degree yaw ability to scan the environment is more suitable and enjoyable for the viewing of a spectator.

Figure 3:
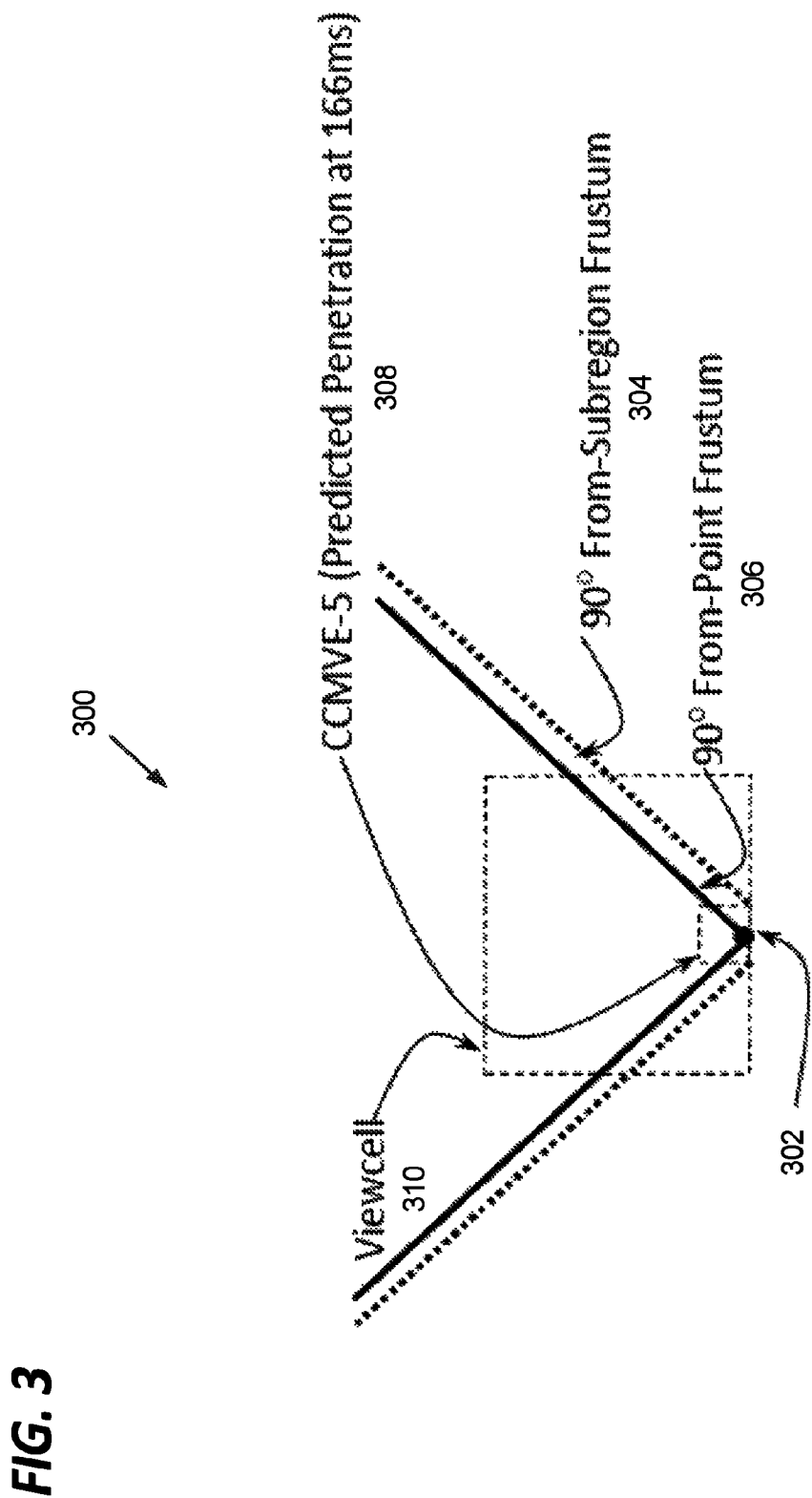
FIG. 3 is an exemplary illustration of a conservative from-subregion frustum, according to certain aspects.

FIG. 3 is an exemplary illustration of a conservative from-subregion frustum 300, according to certain aspects. FIG. 3 shows that the resulting conservative from-subregion frustum 304 is larger than the corresponding from-point frustum 306 at viewpoint 302, even if it assumed that no view direction vector rotation has occurred, for a CCMVE-5 308 representative of predicted viewcell penetration at 166 ms into a viewcell region 310.

Figure 4:
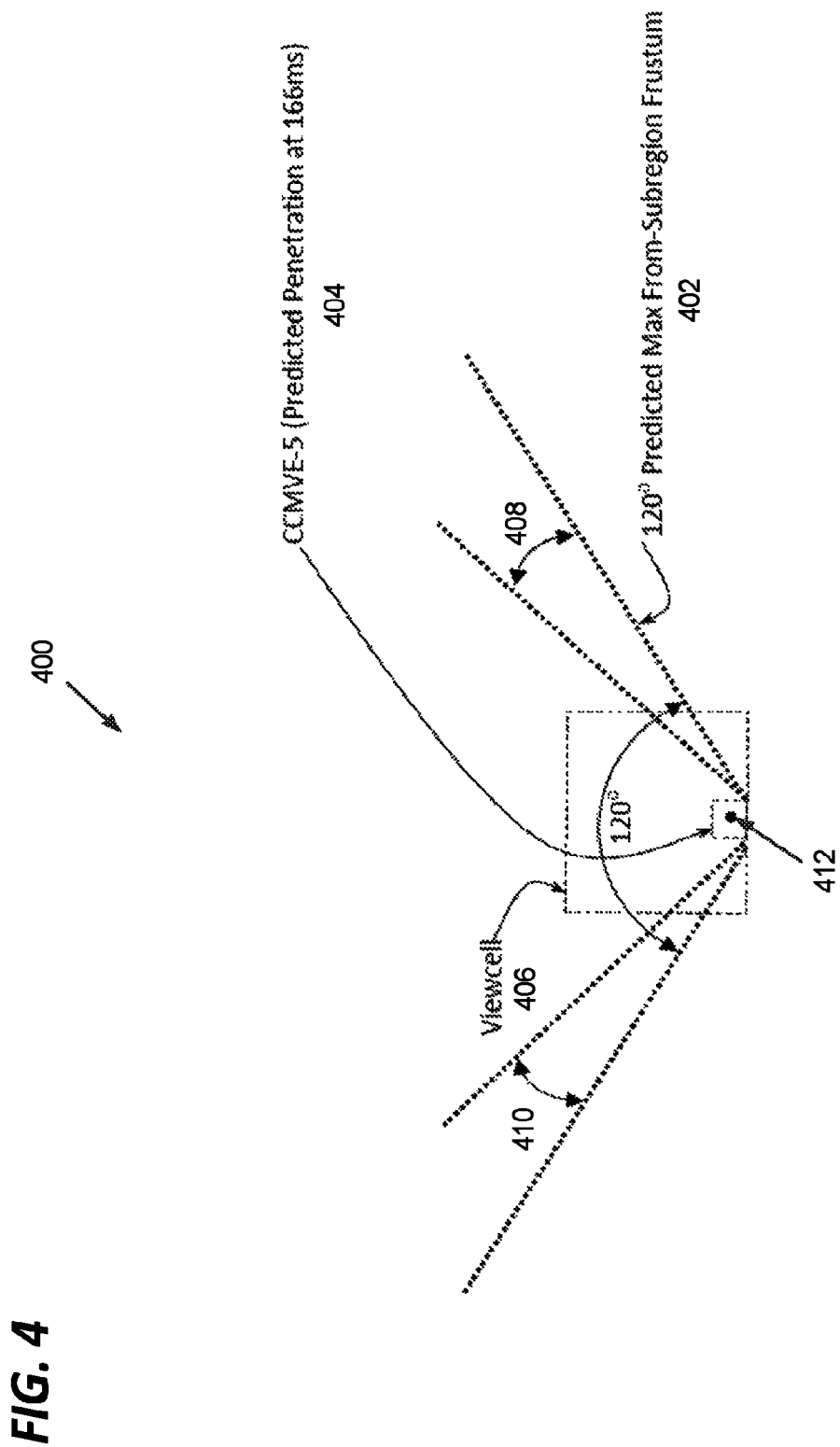
FIG. 4 is an exemplary illustration of a conservative from-subregion frustum that results from viewpoint penetration into the viewcell over 166 milliseconds for a CCMVE subregion, according to certain aspects.

FIG. 4 is an exemplary illustration of conservative from-subregion frustum that results from viewpoint penetration into the viewcell over 166 milliseconds for a CCMVE subregion 400, according to certain aspects. FIG. 4 shows a resulting conservative from sub-region frustum 402 that results from a CCMVE-5 404 representative of viewpoint penetration into the viewcell 406 sub-region over 166 milliseconds, together with rotation of the view direction vector 15 degrees to the right 408 or 15 degrees to the left 410 from an initial view direction vector orientation 412. In this exemplary case, assuming a maximum view direction rotation rate of 90 degrees per second, if the ping latency between the client device 108 and the server 106 is 166 ms, the resulting 30 degree rotation would represent the uncertainty of the client device's 108 view direction vector 412, as experienced by the server 106. Accordingly, consistent with aspects of the present disclosure, the server 106 can employ the extended 120 degree frustum 402 (i.e., 120 degree predicted maximum from-subregion frustum) to determine the subset of the visibility event packet data to actually transmit to the client device 108. This determination is made by determining the set of unsent surfaces of the corresponding visibility event packet that intersect the extended frustum.

In certain aspects, the visibility event packet data is precomputed using the method of first-order from region visibility. The set of surfaces belonging to the corresponding PVS, incrementally maintained using the delta-PVS VE packets, that have not already been sent is maintained using the technique of maintaining the shadow PVS on the server 106. In some aspects, the visibility event packets are precomputed assuming a full omnidirectional view frustum spanning 12.56 steradians of solid angle. As described, in certain exemplary aspects, the server 106 can employ the extended view frustum to cull portions of the precomputed visibility event packet that fall outside of the maximum possible predicted extent of the client device 108 view frustum, as determined from the ping latency and the maximal angular velocity and acceleration of the view frustum, as well as the maximum predicted extent of penetration of the viewpoint into the viewcell.

This method ensures that all of the potentially visible surfaces are transmitted, while minimizing bandwidth requirements, by deferring the transmission of visibility event packet surfaces that are not within the current conservative extended frustum, or which happen to be backfacing with respect to the conservative current maximal viewpoint extent of penetration into the viewcell. In exemplary aspects, there is also described a method of using reduced level-of-detail models in periphery of extended view frustum to reduce bandwidth requirements for buffering against view direction vector rotation, such as level-of-detail vs. predicted exposure durations.

The above-disclosed methods comprise determining a conservative representation of the client device's 108 view frustum from the temporal reference frame of the server 106, and using this extended frustum to cull those surfaces of the corresponding visibility event packet that could not possibly be in the client device's 108 view frustum. Consistent with aspects of the present disclosure, all of the transmitted surface information is represented at the highest level-of-detail. The visibility event packets can be encoded using geometric and surface models at a plurality of levels-of-detail, including a plurality of levels of geometric, texture, and other surface detail. In some aspects, however, the visibility event packets can be transmitted at a lower level-of-detail during periods of low bandwidth availability, and/or high bandwidth requirement, in order to maximize the probability that the information encoding newly exposed surfaces arrives on time, such as before the surface is actually exposed in the client device 108 viewport. Under some conditions, a visibility event packet containing relatively low level-of-detail surface information can initially be transmitted and later replaced by a visibility event packet containing higher level-of-detail information. This exploits the fact that certain 3D map-match systems and/or computer vision systems can have lower precision when matching to newly exposed surfaces and more precision when matching to surfaces that have been exposed for a longer period of time. In this instance, the system has more time to converge on a high-precision match solution for surface elements that are present longer. In certain aspects, sending elements of a visibility event packet that correspond to newly exposed surfaces for the visibility event navigation system 100 at low level-of-detail saves transmission bandwidth while preserving the efficiency of client-side processing, since the level-of-detail of the transmitted information is matched to the spatiotemporal performance profile of the computer vision or 3D map-matching system.

Figure 5:
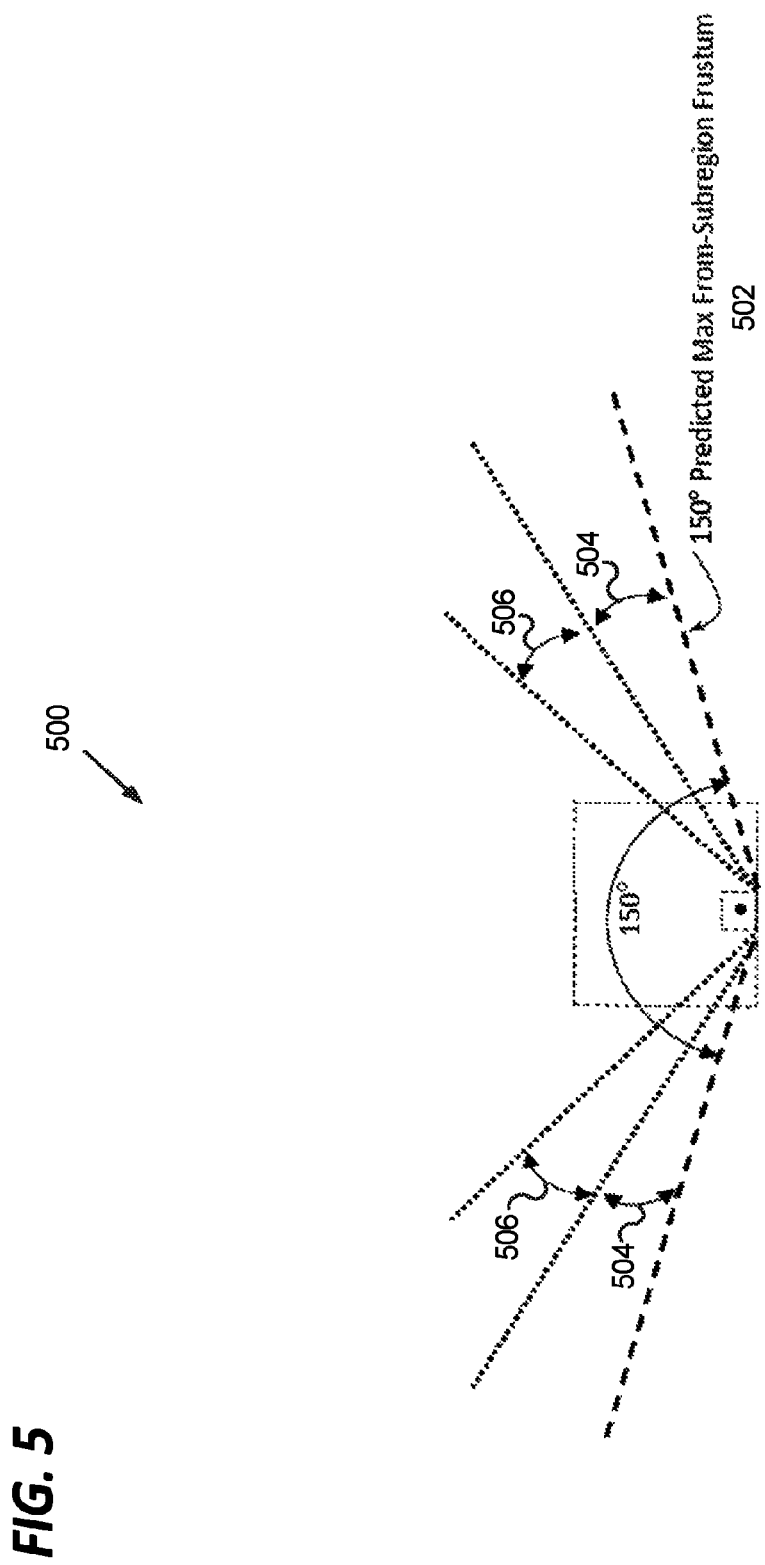
FIG. 5 is an exemplary illustration of an additional angular region of an extended frustum, according to certain aspects.

FIG. 5 is an exemplary illustration of an additional angular region of an extended frustum 500, according to certain aspects. In certain aspects, the limited spatiotemporal performance of robotic vision systems, including 3D map-matching navigation systems and the similarly limited spatiotemporal performance of the human visual system, can be exploited by sending low level-of-detail surface information if surfaces fall outside the region of the extended view frustum, as determined, using one or more of the ping latency, the maximum viewpoint translation velocity and acceleration, the maximum angular velocity, and acceleration of the view direction vector. For example, FIG. 5 shows an additional angular region of extended view frustum 502 that spans an additional 15 degrees 504 on each side of the extended 120 degree frustum 402 shown in FIG. 4.

In certain aspects, the server 106 transmits surfaces that fall in the subfrustum between 120 degrees and the maximally extended frustum of 150 degrees 504 at a lower level-of-detail than the other visibility event surface data that fall within the 120 degree extended frustum. The disclosed method thus provides a region of uncertainty between 90 degrees and 120 degrees of the subfrustum 506, as well as an additional buffer region against view direction vector rotation between 120 degrees and 150 degrees of the subfrustum 504, which may be useful if the directional visibility gradient, when the rate of exposure of surfaces per degree of view direction vector rotation is high, or if the available bandwidth has a high degree of variability, such as network jitter. In this instance, the low level-of-detail surface information can potentially be replaced by a higher level-of-detail representation.

Figure 6:
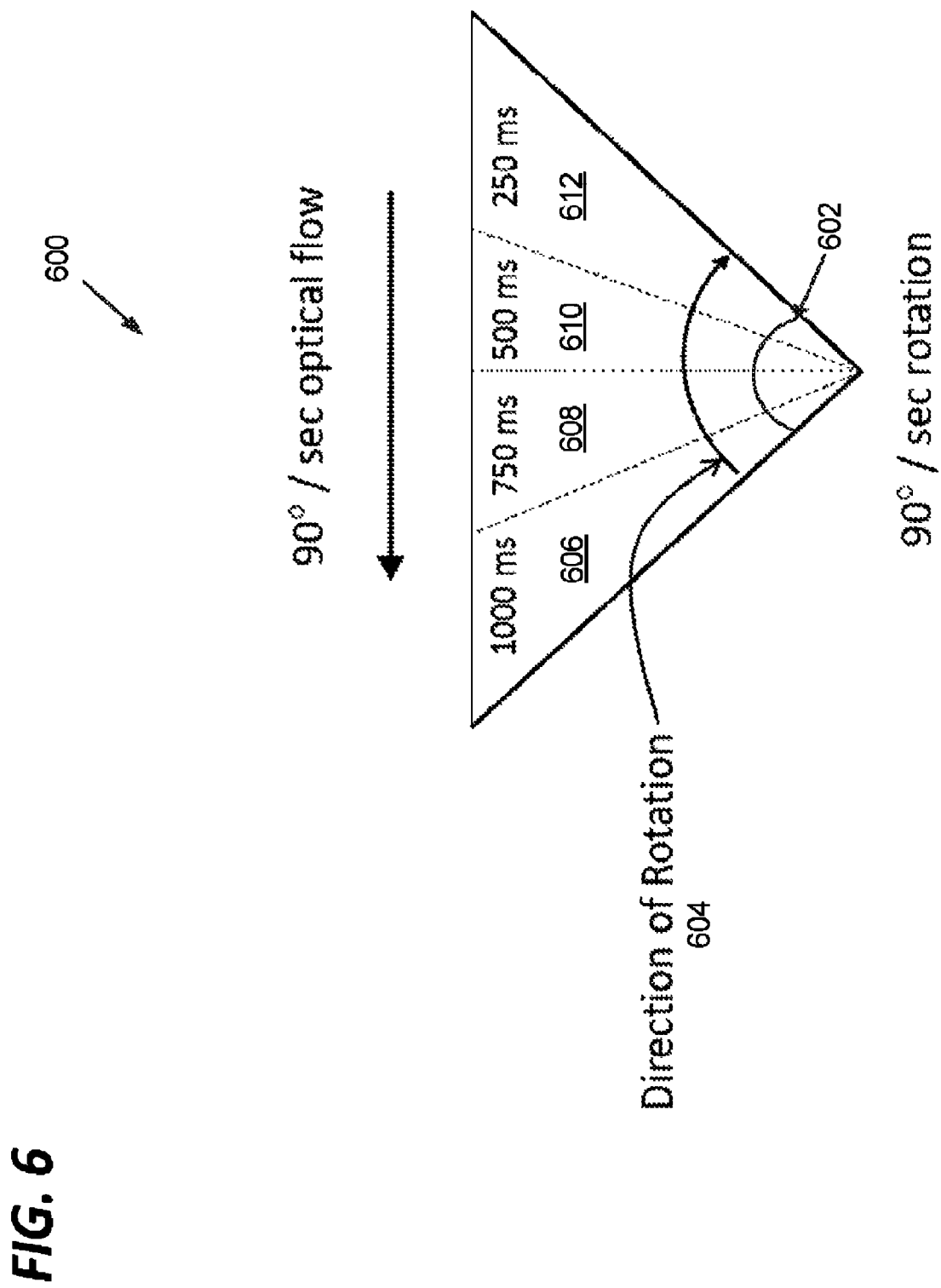
FIG. 6 is an exemplary illustration of a top-down view of a view frustum having a horizontal field of view of 90 degrees and undergoing rotation in the horizontal plane at a rate of 90 degrees per second, according to certain aspects.
Figure 7:
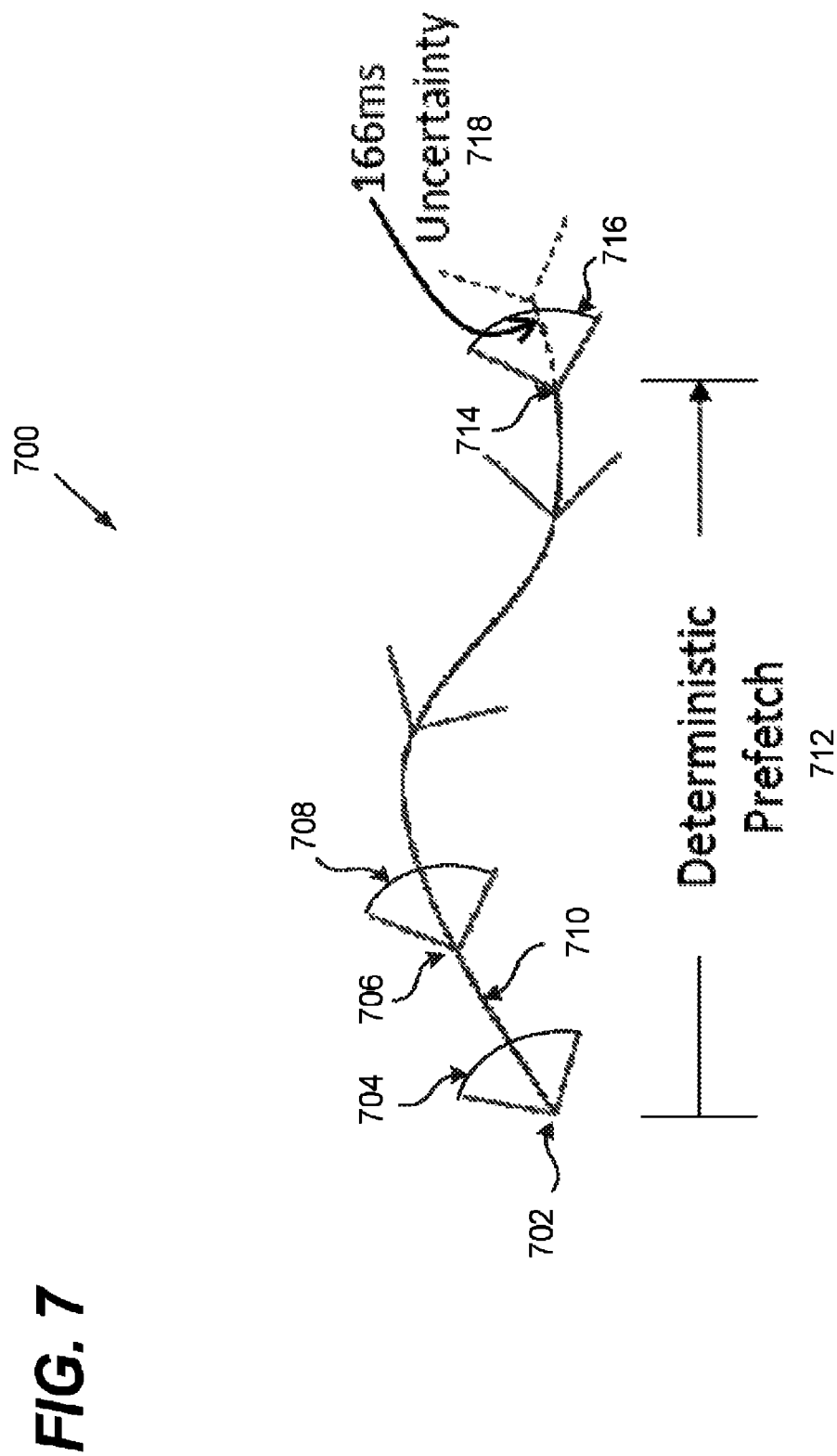
FIG. 7 is an exemplary illustration of a server representation of client device viewpoint position and orientation, according to certain aspects.

FIG. 6 is an exemplary illustration of a top-down view of a view frustum having a horizontal field of view of 90 degrees and undergoing rotation in the horizontal plane at a rate of 90 degrees per second 600, according to certain aspects. FIG. 6 shows a top-down view of a view frustum having a horizontal field of view of 90 degrees 602, and undergoing rotation in the horizontal plane at a rate of 90 degrees per second 604 in a direction from a first region 606 toward a fourth region 612. In this exemplary case, surfaces to the right-hand side of the view frustum 602 will undergo incursion into the rotating frustum at a first region 606, whereas surfaces near the left-hand extreme of the view frustum 602 at the first region 606 will exit the frustum 602 during frustum rotation. In the exemplary case shown in FIG. 6, those surfaces in the first region 606 have been in the frustum 602 for between 750 ms and 1000 ms as a consequence of exposure via the second region 608, the third region 610 and the fourth region 612 during the rotation. In the second region 608, for example, the surfaces have been in the frustum 602 for between 500 ms and 750 ms; in the third region 610, the surfaces have been in the frustum 602 for between 250 ms and 500 ms; and in the fourth region 612, the surfaces have been in the frustum 602 for between 0 ms and 250 ms. Surfaces that have been in the frustum 602 for only a brief period of time have also been exposed to the graphical display in communication with the client device 108 for a concomitantly brief period of time FIG. 7 is an exemplary illustration of a server representation of client viewpoint position and orientation 700, according to certain aspects. The visibility event navigation system 100 can be used for streaming visibility event data as well as other data to a navigating client device 108 such as a vehicle or aircraft. In certain aspects, the client device 108 can be autonomous, semi-autonomous, on-board pilot or driver operated, remotely operated, and the like.

The visibility event navigation system includes a server 106 that can be configured to employ a navigation-based prefetch scheme in which the entire specified navigational route to an intended destination is predetermined. In certain aspects, all of the corresponding visibility event navigational packets, for the entirety of the navigational route, can be transmitted by the circuitry of the server 106 to the client device 108 as a download prior to initiating navigation. Alternatively, all of the visibility event navigational packets can be streamed to the client device 108 during an initial portion of the trip, in which the visibility event packets being streamed correspond to viewcell boundaries that may be penetrated during movement of the client device 108 within the specified 3D navigational route. In this instance, the visibility event navigational server 106 and client device 108 do not require a network connection that is constantly available. However, if the specified navigational route is changed by the server 106 due to traffic, environmental changes, or any other reasons for re-routing, the previous set of visibility event navigational packets, corresponding to the original specified navigational route beyond the point of rerouting, may be delivered unnecessarily, making inefficient use of the available network bandwidth.

In other aspects, the visibility event navigational packets can be streamed in a demand-paged mode in which the server 106 monitors the actual location of the navigating visibility event client device 108 from self-position reports of the client device 108, sensor 104 data, and/or position reports of other participating navigating client devices, and streams the corresponding visibility event navigation packet to the navigating client device 108 just before the packet is needed.

In some aspects, a prefetch method which balances the constraints of reducing bandwidth requirements while reliably preventing visibility event cache underflow on the client device 108 can be used. In this instance, the server 106 prefetches the visibility event packets using a navigation-predictor agent that is virtually navigating (within the server-side environmental model) at a specified distance or a specified time ahead of the client device 108 (navigating in the corresponding real environment). As such, the server-side navigation-predictor agent can be controlled by the server 106 to maintain a position that is ahead of the actual navigating client device's 108 corresponding position by a defined period which exceeds the round-trip time network delay between the server 106 and the client device 108. In certain aspects, the defined period is short enough to allow the intended navigational route to be changed at any time before too much bandwidth has been committed to delivering information for a diverted route. In certain aspects, the server 106 and/or the client device 108 can modulate velocity along the intended navigational route in order to avoid visibility event cache underflow. This variable-delay navigational prefetch method is described in the copending parent application Ser. No. 15/013,784. In certain aspects of the present disclosure, the navigational prefetch method for streaming visibility event navigational packets support 3D map-match and other computer vision based navigation in real environments.

The server representation of client position and orientation 700 describes a method of navigation-based prefetch of visibility event navigational packets in which the area and/or volume of navigational prediction collapses to a precise navigational route. The server representation of client position and orientation 700 includes a current location of the navigating client 702, a current frustum 704. The frustum representing the scan frustum for a LiDAR scanner, an active sensor, a passive sensor, and the like. The position at a second location 706, a second frustum 708, a pursuit route of navigation 710, deterministic prefetch 712, a future position 714, a future frustum 716, and probabilistic prefetch 718. The current position 702 follows a navigation route indicated by a future position 714. In certain aspects of the present disclosure, the current position 702 follows two seconds behind a future position 714. The current position 702 can provide a first frustum 704 which indicates the field of view of the client navigational sensor 104 at the current position 702.

The circuitry of the server 106 modifies the position of the future position 714 directly. The future positions act as a virtual navigational prefetch agent, moving ahead on the pursuit route 710 in the modeled environment, which corresponds to the client device's 108 navigational route in the real environment.

The current position 702 can represent the position of the navigating client device 108 in the real environment, as communicated between the client device 108 and the server 106. In certain aspects, the position of the client device 108 can change location as a result of the movement of the future position 714. For example, the current position 702 can move along a specified navigational route 710 towards a second position 706. The position at the second location 706 can include a second frustum 708 in which the field of view of the sensor 104 at a position at the second location 706 is represented, based on the intended heading of the navigating client device 108 at position 706. In some aspects, the fields of view are processed by the circuitry of the client device 108 to match the sensor data, obtained within the frustum to the portions of the environmental model, delivered by the visibility event packets from the server 106, that are within a corresponding virtual frustum.

The current position 702, the position at the second location 706 and the future position 714 travel along the intended navigational route 710, which corresponds to the commands received by the circuitry of the server 106. Additionally, the circuitry can be configured to pre-signal the intended navigational route with respect to the location of the future position 714. The server representation of client position and orientation 700 can predict navigational intent with minute uncertainty, such as 166 milliseconds. The low value of uncertainty allows network latency to be concealed when the server updates the future position 714. The future position 714 is illustrated as being the position of the server's virtual navigational prefetch agent at a time 166 ms after a coordinated current time.

The current instantaneous state of the real navigational environment is known to the virtual navigational prefetch agent of the server 106 with a dilution of precision that reflects the round trip time (RTT) between the server 106 and the sensor 104 utilized to report locations of objects in the real environment.

The position and orientation of the future position 702 is known to the server 106 with dilution of precision that reflects the 166 ms RTT between the client device 108 and the server 106. The circuitry of the server 106 can determine the position and orientation of the future position to within ½*RTT, however, any visibility event packet transmitted from the server 106 to the client device 108 will be delayed an additional ½*RTT, making the effective precision bounds limited to RTT. Consistent with certain aspects of the present disclosure, it is assumed that the dilution of precision is determined by the full RTT.

In some aspects, the circuitry of the server 106 determines representations of the future position 714 and transmits the representations to the client device 108. The representations can be less than RTT old (time elapsed from the current time) and have a dilution of precision that is a function of (RTT—elapsed time). The server 106 representation of the future position 714 includes a future frustum 716 and corresponding probabilistic prefetch 718 which can be utilized to determine a predictive route of uncertainty. This predictive route of uncertainty utilizes the probabilistic prefetch 718 in which the future position 714 and orientation states less than RTT time has elapsed from the current time is shown as a dashed trajectory with a future frustum 716, otherwise referred to as a superimposed navigational cone of uncertainty, reflecting the server's 106 effective uncertainty of position and/or orientation of the future position 714.

As such, when the RTT exceeds the elapsed time, then the server's 106 representation of the current position 702 is undiluted by the RTT uncertainty, and the server's 106 representation of the deterministic prefetch 712 portion of the position 710 can be represented by the server 106 as a space curve with a specific view direction vector for each position on the space curve.

As limits are placed on the current position 702 and the position at the second location 706, the predictability of navigation is enhanced. The area and/or volume of the corresponding current frustum 704 and the second frustum 708 are decreased. The decrease in area and/or volume of the current frustum 704 and the second frustum 708 further places limits onto the predicted position of navigation 710, effectively decreasing the bandwidth required for visibility event packet streaming.

Additionally, the predicted position 710 can be utilized to defer the transmission of significant portions of the visibility event packets. The visibility event protocol defined by a navigation driven predictive prefetch of precomputed visibility event packets is an incremental and progressive method of streaming navigational data. In some aspects of the present disclosure, a series of partial and/or deferred visibility event packets that reflect predicted sequences of viewcell-to-viewcell boundaries are processed via the circuitry of the server 106. As such, runtime conservative view frustum culling methods are employed in which some parts of a particular visibility event packet, corresponding to a first viewcell boundary, may go untransmitted, even as the position penetrates later transited viewcell boundaries.

By having the navigating client device 108 follow the future position of the virtual navigational prefetch agent of the server 106 by 2000 ms, the prefetch of visibility event packets essentially becomes deterministic. This reduces the bandwidth required to stream the visibility event packets, while enabling the virtual navigational prefetch agent of the server 106 to respond to changes occurring along the intended navigational route by transmitting a new stream of visibility event packets corresponding to a diverting route in a time period between 166 ms and 2000 ms, as shown in FIG. 7.

Figure 8:
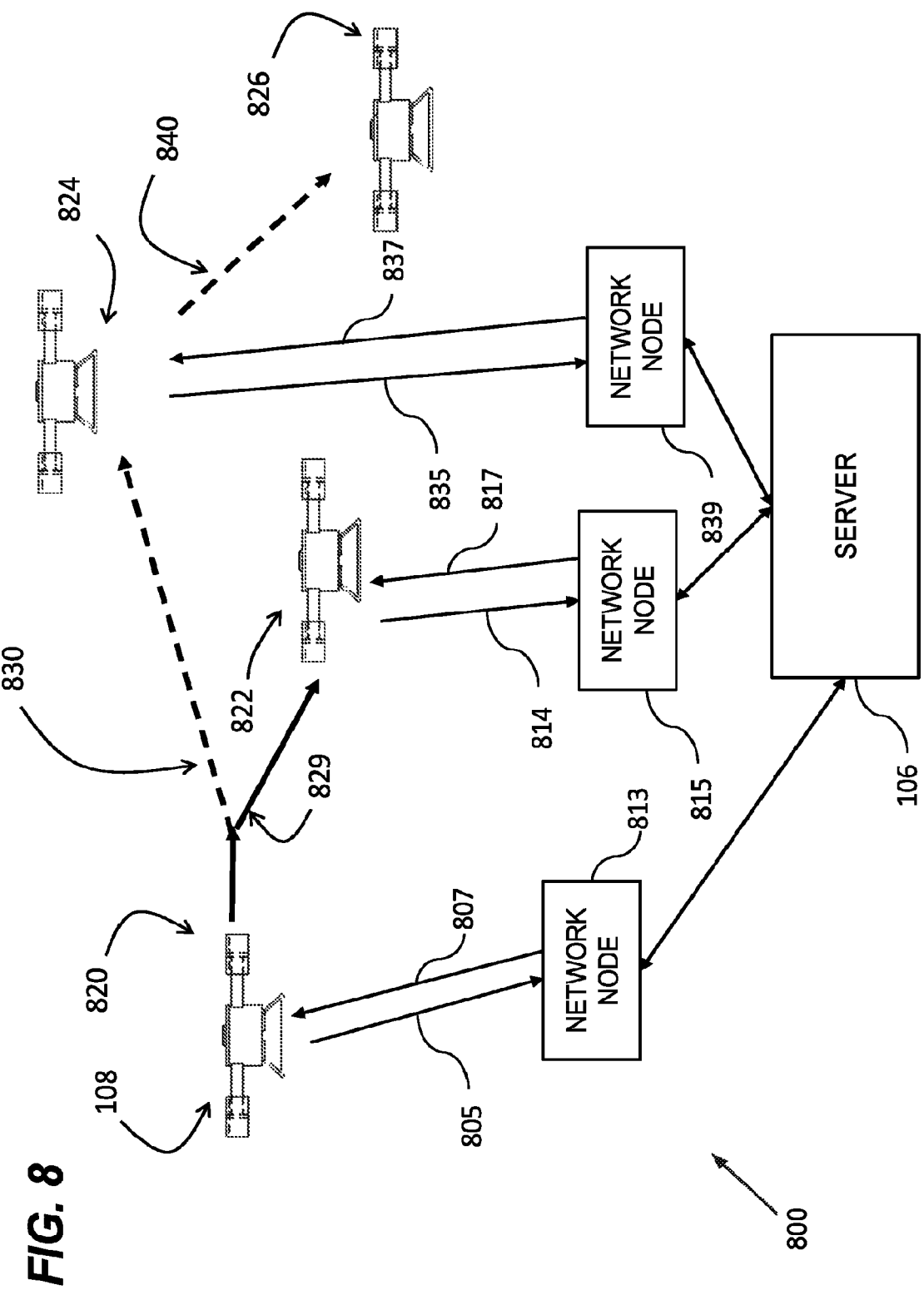
FIG. 8 is an exemplary illustration of an architectural block diagram of a visibility event navigation system, according to certain aspects.

FIG. 8 describes a high-level architectural block diagram of the visibility event navigation system 800, according to certain aspects. The visibility event navigation system 100 can be attributed to a navigation system on-board a human-operated, autonomous, or semi-autonomous aircraft or ground vehicle. FIG. 8 illustrates an exemplary navigation system including a client device 108 such as an on-board an autonomous quadrotor aircraft in various stages of flight corresponding to locations 820, 822, 824 and 826.

The visibility event navigation system 100 can include a network 102 including a plurality of network nodes 813, 815 and 839. The network 102 including network nodes 813, 815 and 839 can include wireless networks such as Wi-Fi, BLUETOOTH, cellular networks including EDGE, 3G and 4G wireless cellular systems, IMS, or any other wireless form of communication that is known, and may also encompass wired networks, such as Ethernet.

At the position 820, the client device 108 transmits a request for a navigational route to an intended destination which may be an individual home, a business building, a porch, a rooftop, an inside of a structure, and the like. Transmission of the request 805 to the server 106 employs a network node 813. The server 106 authenticates the identity of the client device 108 and transmits 807 initial visibility event navigation data corresponding to the visibility event packets for viewcells on the navigational route to the intended destination. The navigational route can include a portion of the environment represented by a set of connected viewcells within the navigable 3D space of the environment and a corresponding model of the environment. Once the initial visibility event navigation packets are received at the client device 108, the client device 108 proceeds from the initial location 820 to location 822 along the navigational route to the intended destination. At location 822, the client device 108 can be configured to determine location information using data detected at a sensor 104 in communication with the client device 108. The sensor 104 can be utilized by the client device 108 to determine, directly or indirectly, surface information including the location of the visible 3D surfaces surrounding the client device 108 and compare this surface information to the relevant 3D environmental model data delivered by the visibility event navigational stream. This location information is transmitted to the client device 108 through the communication network node 815 in transmission 814.

After receiving the transmission 814 from the client device 108 at position 822 via the network node 814, the server 106 determines whether the client device 108 at location 822 is located along the navigational route to the intended destination. If the client device 108 is determined to be located along the navigational route to the intended destination, then the server transmits 817 additional visibility event navigational packets for viewcells further along the navigational route to the intended destination. In some aspects of the present disclosure, the transmission 817 from the server 106 includes visibility event navigation data corresponding to the visibility event packets for viewcells on one or more alternate routes to save landing zones.

FIG. 8 further shows the client device 108 at position 824. Position 824 depicts a location that is not on the navigational route to the intended destination, but on a route 840 that substantially deviates from the navigational route. After receiving the transmission 835 from the client device 108 at position 824 via the network node 839, the server 106 determines that client device 108 is located on the navigational route to the intended destination. If the client device 108 is determined to not be on the navigational route, then the server may transmit a signal 837 from the network node 839 to the client device 108 at position 824 including a safe landing command. In some aspects, the safe landing command causes the client device 108 to utilize the visibility event packets for the alternate route to a safe landing zone to navigate along the route to the safe landing zone 840 and land at position 826. In certain aspects, this safe landing command may be implemented as a default behavior of the visibility even navigation system in instances where communication between the client device 108 and the server 106 is interrupted for a predetermined period of time.

Figure 9:
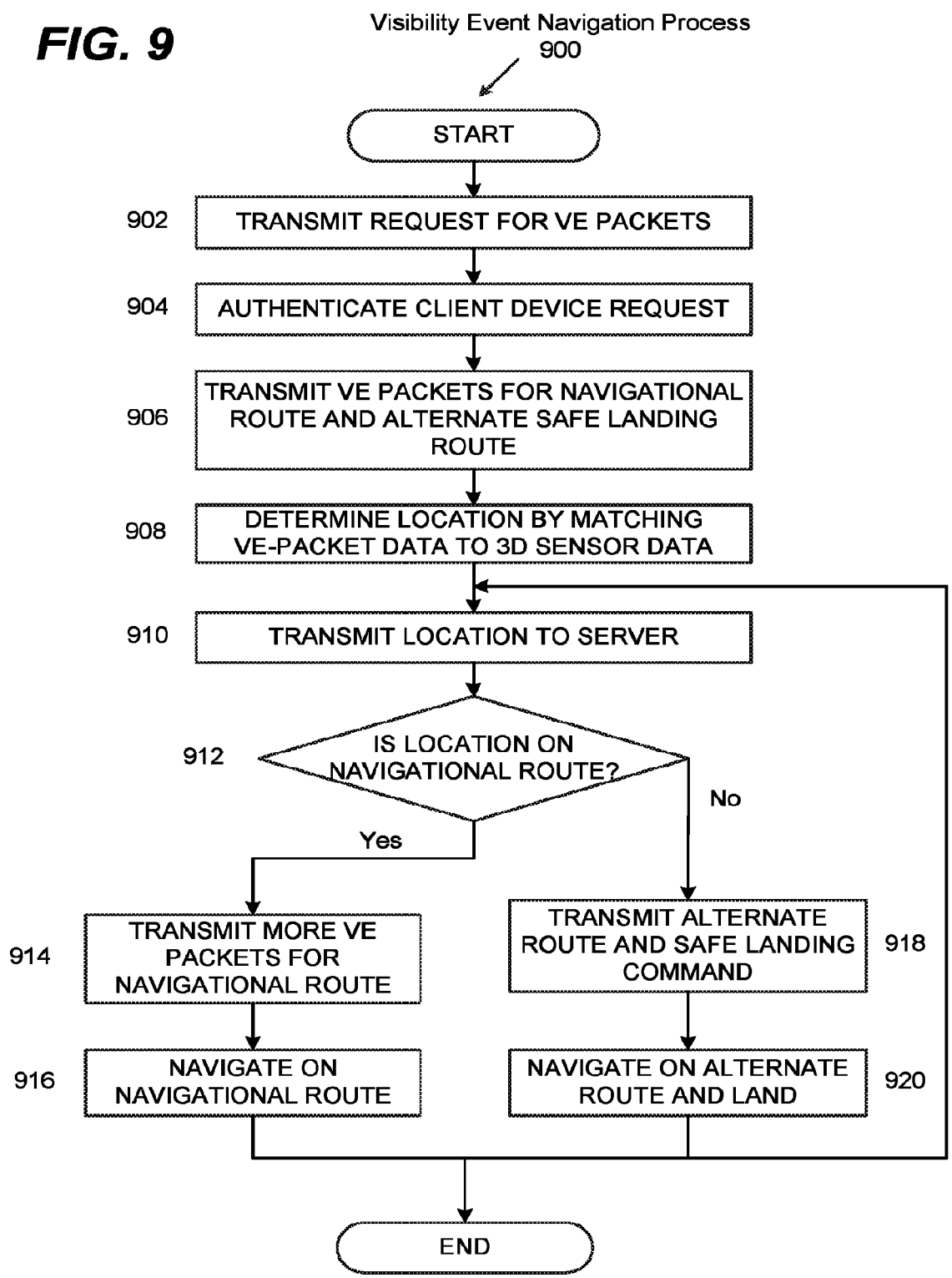
FIG. 9 is an algorithmic flowchart of a visibility event navigation process, according to certain exemplary aspects.

FIG. 9 is an algorithmic flowchart of a visibility event navigation process 900, according to certain exemplary aspects. The visibility event navigation process 900 describes a client device 108 navigating along a navigational route and the transmission of an alternate route and safe landing command if the client device 108 strays from the navigational route. At step 902, the circuitry of the client device 108 transmits a request to the server 106 for visibility event packets. The visibility event packets can be navigational packets that correspond to the navigational route that the client device 108 intends to traverse.

At step 904, the server 106 in communication with the client device 108 authenticates the request of the client device 108. In certain aspects, the server 106 is configured to deliver visibility event packets to certified client devices 108 which present authenticated credentials using a secure process of authentication, such as a cryptographic ticket. The transmission of visibility event packets to certified client devices 108 ensures that the client device 108 has met certain requirements for navigating along the intended route.

At step 906, the circuitry of the server 106 transmits visibility event navigational packets to the client device 108. The initial navigational packets may include a subset of the entire set of visibility event packets corresponding to the contiguous viewcells of the navigable space representing the specified navigational route to the intended destination. In some aspects, the circuitry of the server 106 transmits visibility event data representing the set of visibility event packets corresponding to the contiguous viewcells of the navigable space representing the route to a safe landing zone.

At step 908, the circuitry of the client device 108 employs the relevant visibility event packet navigational data and 3D sensor data to determine location of the client device 108 within the real environment using 3D map-matching. In some aspects, the matching includes other matching methods, computer vision methods, and the like. The matching may result in a position relative to the relevant obstacle or target surfaces in the real environment. The determination can also result in latitude, longitude, and/or altitude calculations if the environmental model data of the visibility event packets is geo-registered.

At step 910, the circuitry of the client device 108 transmits information corresponding to the location of the client device 108 in the real environment to the server 106. In certain aspects, the location information can includes latitude, longitude, and/or altitude calculations if the environmental model data of the visibility event packets is geo-registered.

At step 912, a determination is made of whether the client device 108 is located along the specific navigational route. In some aspects, the server 106 determines if the transmitted location of the client device 108 is on the navigational route. In certain aspects, the determination can employ multiple parameters to determine if the location of the navigating client device 108 substantially deviates from the navigational route. For example, the parameters can include the average distance from the navigational route over a predetermined period of time in which the desired route is defined as a navigational route bounded by an allowed region of navigational uncertainty reflecting a known or desired precision in navigation. If the client device is determined to be located along the navigational route, resulting in a "yes" at step 912, the visibility event navigation process 900 proceeds to step 914. Otherwise, if the client device is determined to not be located along the navigational route, resulting in a "no" at step 912, the visibility event navigation process 900 proceeds to step 918.

At step 914, the circuitry of the server 106 transmits additional visibility event navigation packets corresponding to viewcells that are farther along the specified navigational route to the client device 108.

At step 916, the client device 108 receives the instructions transmitted from the server 106 and continues to navigate along the specified navigational route. In some aspects, the visibility event navigation process 900 ends after completing step 916. In other aspects, the visibility event navigation process 900 proceeds to step 910.

At step 918, the circuitry of the server 106 transmits a command to the client device 108 in which the client device 108 is provided with instructions to navigate on an alternate route towards a safe landing zone and land at the safe landing zone.

At step 920, the client device 108 navigates along the alternate route and lands at the safe landing zone. In certain aspects, the visibility event navigational client executes an internal instruction to follow an alternate route to a safe landing zone and land if communication with the visibility event navigational server is interrupted. In some aspects, the visibility event navigation process 900 ends upon the completion of step 920. In other aspects, the visibility event navigation process 900 proceeds to step 910.

Figure 10:
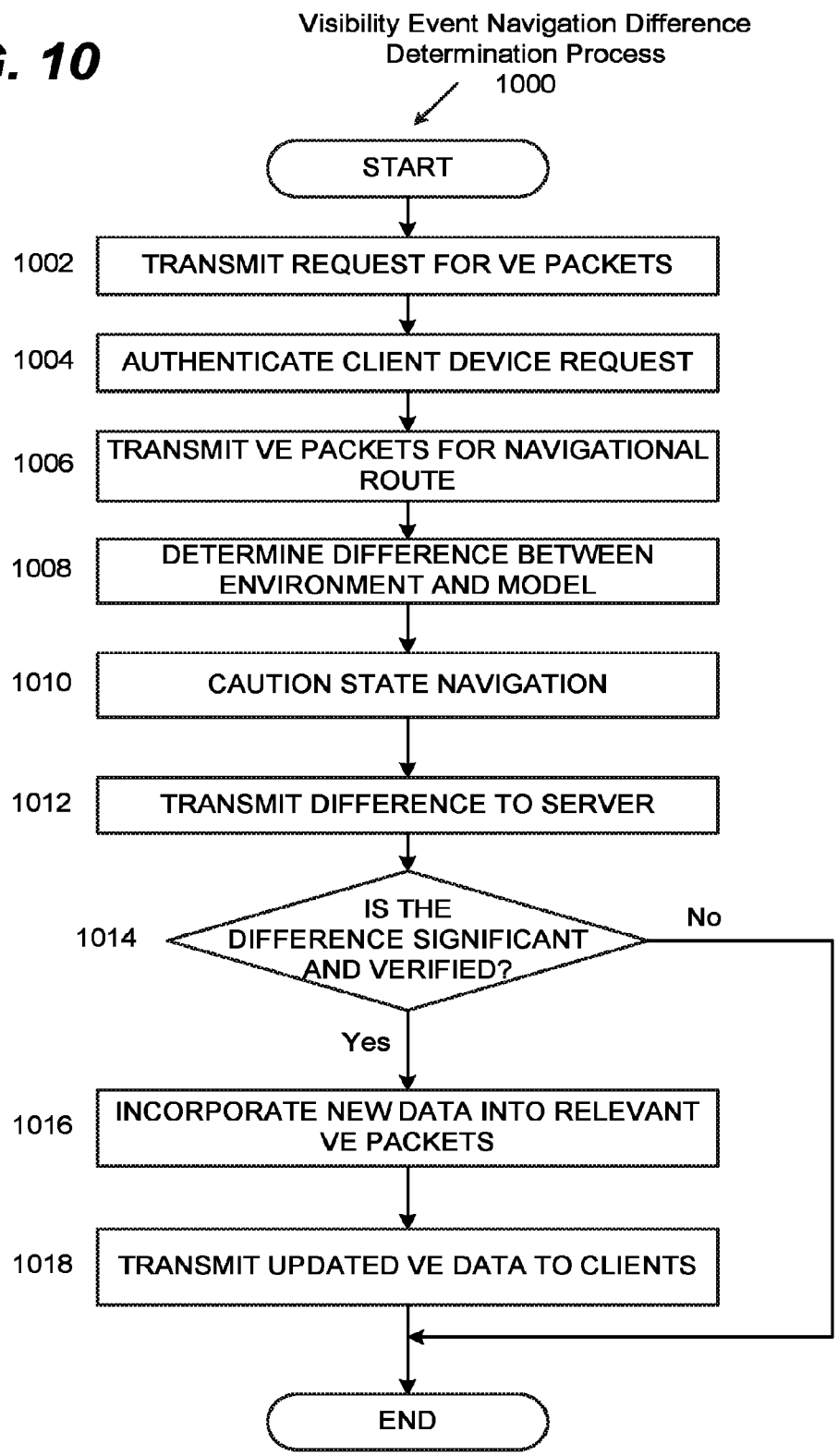
FIG. 10 is an algorithmic flowchart of a visibility event navigation difference determination process, according to certain exemplary aspects.

FIG. 10 is an algorithmic flowchart of a visibility event navigation difference determination process 1000, according to certain exemplary aspects. The visibility event navigation difference determination process 1000 describes a client device 108 navigating along a navigational route and the determination of a deviation of the client device 108 from the navigational route. At step 1002, the circuitry of the client device 108 transmits a request to the server 106 for visibility event packets. The visibility event packets can be navigational packets that correspond to the navigational route that the client device 108 intends to traverse.

At step 1004, the server 106 is in communication with the client device 108 and authenticates the request of the client device 108. In certain aspects, the server 106 is configured to deliver visibility event packets to certified client devices 108 which present authenticated credentials using a secure process of authentication, such as a cryptographic ticket. The transmission of visibility event packets to certified client devices 108 ensures that the client device 108 has met certain requirements for navigating along the intended route.

At step 1006, the circuitry of the server 106 transmits visibility event navigational packets to the client device 108. The initial navigational packets may include a subset of the entire set of visibility event packets corresponding to the contiguous viewcells of the navigable space representing the specified navigational route to the intended destination.

At step 1008, the circuitry of the client device 108 determines a difference between the environmental model data delivered by the visibility event packets and the corresponding 3D ground-truth, as determined using the 3D sensor data of a sensor 104 that is in communication with the client device 108. In certain aspects, the difference determination occurs during the 3D map-matching in which the environmental model data supplied by the visibility even packets and the 3D data acquired by the sensor 104 determine the location of the client device 108 within the real environment. The difference determination of step 1008 may employ one or more statistical metrics of 'fit' as determined by an iterative closest points algorithm or other matching algorithm including variations of the iterative closest points algorithm in which real-time acquired sensor point cloud data is matched to model polygons or other surface representations used in the corresponding environmental model.

At step 1010, a caution state in navigation is initiated at the client device 108 via the circuitry of the client device 108. In certain aspects, the difference between the representation of the environment and the ground truth scan from the sensor 104, results in the circuitry utilizing the visibility event packet data with caution in the immediate area the client device 108 is located at. In this state of cautious navigation, the visibility event navigation can employ less precise navigational methods such as SLAM, GPS, and the like. As such, the more precise 3D map-matching or other computer vision based navigation can resume when there is sufficient match between the delivered model data and the real-time sensor data that does not surpass a predetermined difference threshold.

At step 1012, the difference information obtained by the circuitry of the client device 108 is transmitted from the client device 108 to the server 106. In certain aspects, the visibility event navigation system 100 exploits the fact that the amount of information generally required to represent a difference over any modest period, for example in an urban environment, is very small compared to the amount of information required to represent the urban environment. As such, this small amount of difference information can be transmitted as raw point cloud data or could be first semi-processed, for example into a voxel representation, or into a procedural parametric representation. In some aspects, the difference information is processed into polygon or procedural surfaces that can be encoded as visibility event packets for transmission to the server 106.

At step 1014, a determination is made of whether the difference information is significant and verified. In some aspects, verification of the difference information can include the server 106 receiving substantially the same or similar difference information, for the same corresponding region of the navigated environment, from a plurality of client devices 108 over a predetermined period of time. In certain aspects, the significance of the difference can include spatial metrics, or other metrics that weigh the importance of the change to navigation. For example, the change information can indicate a new structure that impedes navigation along one or more navigation routes. In other aspects, the significance of the change information can include metrics of saliency to the client device 108 including 3D map-matching or other computer vision algorithms that use the real surfaces and the corresponding environmental 3D model data, delivered as visibility event packets. If the delivered environmental change information satisfies a predetermined threshold for significance, resulting in a "yes" at step 1014, the visibility event navigation difference determination process 1000 proceeds to step 1016. Otherwise, if the delivered environmental change information does not satisfy a predetermined threshold for significance, resulting in a "no" at step 1014, the visibility event navigation difference determination process 1000 ends.

At step 1016, the changes to the environmental model are incorporated and encoded as visibility event packets by the circuitry of the server 106.

At step 1018, the visibility event packets are transmitted on an on-demand basis to any subsequent client devices 108 in which the changed surfaces are unoccluded from the viewcells defining the current navigational route. In certain aspects, the transmission employs the same navigation-based predictive prefetch used to transmit the unchanged packets. In some aspects, the updated visibility even navigation data is received by a second client device. For example, the second client device can include an aircraft or ground vehicle that has entered, or plans to enter regions of the real environment in which the changes detected by the client device 108 have now been encoded as visibility event packets.

Figure 11:
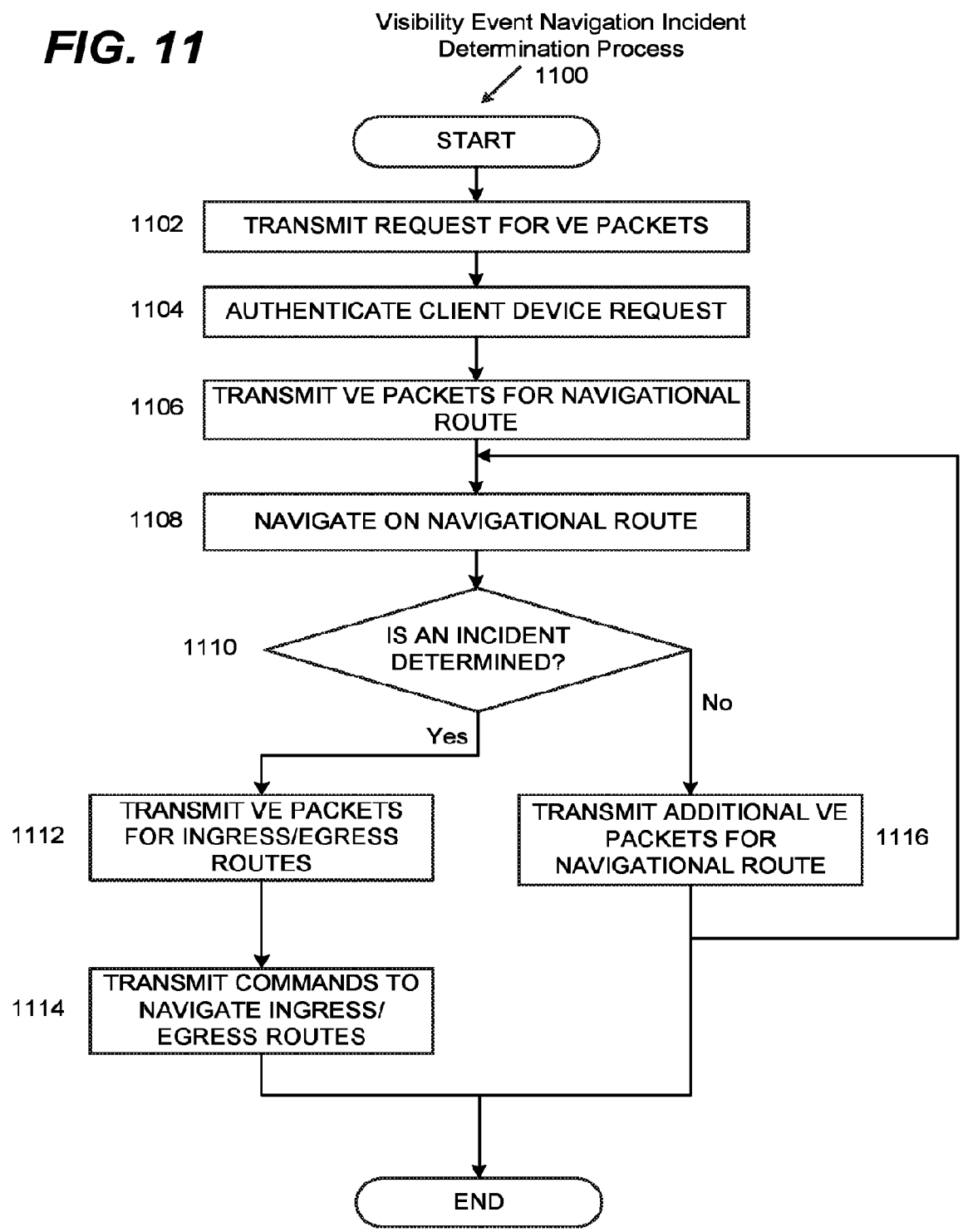
FIG. 11 is an algorithmic flowchart of a visibility event navigation incident determination process, according to certain exemplary aspects.

FIG. 11 is an algorithmic flowchart of a visibility event navigation incident determination process 1100, according to certain exemplary aspects. The visibility event navigation incident determination process 1100 describes a client device 108 that navigates to a determined incident location or a location along an ingress/egress route to/from the incident location. At step 1102, the circuitry of the client device 108 transmits a request to the server 106 for visibility event packets. The visibility event packets can be navigational packets that correspond to the navigational route that the client device 108 intends to traverse.

At step 1104, the server 106 is in communication with the client device 108 and authenticates the request of the client device 108. In certain aspects, the server 106 is configured to deliver visibility event packets to certified client devices 108 which present authenticated credentials using a secure process of authentication, such as a cryptographic ticket. The transmission of visibility event packets to certified client devices 108 ensures that the client device 108 has met certain requirements for navigating along the intended route.

At step 1106, the circuitry of the server 106 transmits visibility event navigational packets to the client device 108. The initial navigational packets may include a subset of the entire set of visibility event packets corresponding to the contiguous viewcells of the navigable space representing the specified navigational route to the intended destination.

At step 1108, the client device 108 navigates along the specified navigational route.

At step 1110, a determination is made of whether an incident has occurred. In certain aspects, the circuitry of the server 106 determines if there has been an incident in the real environment. In some aspects, the incident may be an event that threatens public safety or security. If an incident is determined to be present, resulting in a "yes" at step 1110, the visibility event navigation incident determination process 1100 proceeds to step 1112. Otherwise, if an incident is not determined to be present, resulting in a "no" at step 1110, the visibility event navigation incident determination process 1100 proceeds to step 1116.

At step 1112, visibility event packets corresponding to a route to the incident location are transmitted from server 106 to the client device 108 via the circuitry of the server 106. In certain aspects, the transmitted visibility event packets can correspond to one or more ingress or one or more egress routes that are to or from the incident location.

At step 1114, the circuitry of the server 106 transmits a command to the client device 108, which instructs the client device 108 to navigate to the incident location or to a location along the ingress/egress routes that are to/from the incident. In certain aspects, the diversion of the client device 108 to an egress route enables surveillance for incident perpetrators attempting to escape from the incident location. As described in copending parent application Ser. No. 13/807,824, the method of precomputing visibility event packets using conservative linearized umbral event surfaces can incorporate identifying the navigable space of the environment and possible routes within the modeled space, including ingress and egress routes. In exemplary aspects, visibility event packets delivered in step 460 can include those corresponding to positions from which egress routes and ingress routes are unoccluded and which provide good vantage points for mobile surveillance.

At step 1116, the circuitry of the server 106 transmits more visibility event navigational packets for the specified route to the client device 108. In some aspects, the visibility event navigation incident determination process 1100 proceeds to step 1108 upon the completion of step 1116. In other aspects, the visibility event navigation incident determination process 1100 ends upon the completion of step 1116.

Figure 12:
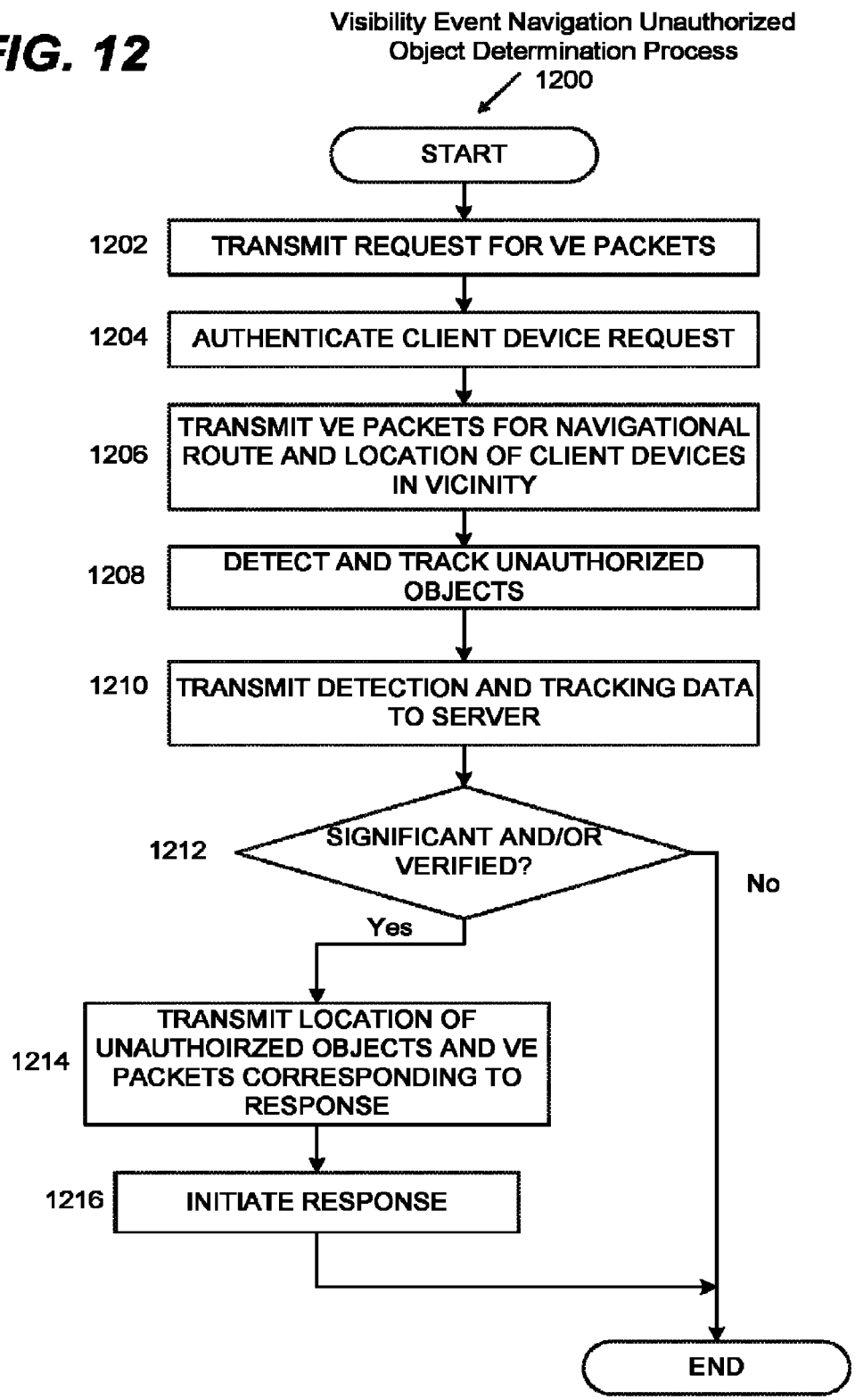
FIG. 12 is an algorithmic flowchart of a visibility event navigation unauthorized object determination process, according to certain exemplary aspects.

FIG. 12 is an algorithmic flowchart of a visibility event navigation unauthorized object determination process 1200, according to certain exemplary aspects. The visibility event navigation unauthorized object determination process 1200 describes a process of detecting and responding to unauthorized objects in a real environment. At step 1202, the circuitry of the client device 108 transmits a request to the server 106 for visibility event packets. The visibility event packets can be navigational packets that correspond to the navigational route that the client device 108 intends to traverse.

At step 1204, the server 106 is in communication with the client device 108 and authenticates the request of the client device 108. In certain aspects, the server 106 is configured to deliver visibility event packets to certified client devices 108 which present authenticated credentials using a secure process of authentication, such as a cryptographic ticket. The transmission of visibility event packets to certified client devices 108 ensures that the client device 108 has met certain requirements for navigating along the intended route.

At step 1206, the circuitry of the server 106 transmits visibility event navigational packets to the client device 108. The initial navigational packets may include a subset of the entire set of visibility event packets corresponding to the contiguous viewcells of the navigable space representing the specified navigational route to the intended destination. The circuitry of the server 106 also transmits information representing the location of authorized client devices 108 operating in the vicinity of the specified navigational route. In certain aspects, the vicinity includes an area within a predetermined sensor range of the specified navigational route, wherein the sensor range includes the range of a sensor 104 that is in communication with the client device 108.

At step 1208, the circuitry of the client device 108 detects unauthorized moving objects in the real environment. In certain aspects, the real environment includes airspace. The method of detection can include one or more methods of detecting moving objects via on-board LiDAR, SONAR, Radar, optical sensors, or any other detection means that are known. In some aspects, utilizing the information describing known locations of authorized client devices in the vicinity can improve the detection of unauthorized moving objects. The client device 108 can also use the sensor 104 such an on-board sensor to detect, track, and report the location of other authorized client devices 108, or authorized client devices 108 that have lost communication with the server 106.

At step 1210, the circuitry of the client device 108 transmits information describing the location of unauthorized moving objects to the server 106.

At step 1212, a determination is made of whether the detection of a moving object is significant and/or verified. In certain aspects, the determination of significance may include size, speed and other parameters of the moving object. In some aspects, the verification may include repeated, correlated observations from multiple client devices 108 or other authenticated sources. If the moving object is determined to be significant and/or verified, resulting in a "yes" at step 1212, the visibility event navigation unauthorized object determination process 1200 proceeds to step 1214. Otherwise, if the moving object is determined to not be significant or verified, resulting in a "no" at step 1212, the visibility event navigation unauthorized object determination process 1200 ends.

At step 1214, the circuitry of the server 106 transmits the location of the unauthorized object such as an aircraft or ground vehicle to a client device. The circuitry of the server 106 can also be configured to transmit the visibility event packets corresponding to an intercept or pursuit route to the unauthorized object. In some aspects, the server 106 can also transmit a command to the client device 108 which instructs the client device 108 to pursue, track, or otherwise engage the detected unauthorized object.

At step 1216, the client device 108 initiates pursuit, tracking, or engagement of the unauthorized object by following a pursuit route or intercept route specified by the visibility event packets.

Figure 13:
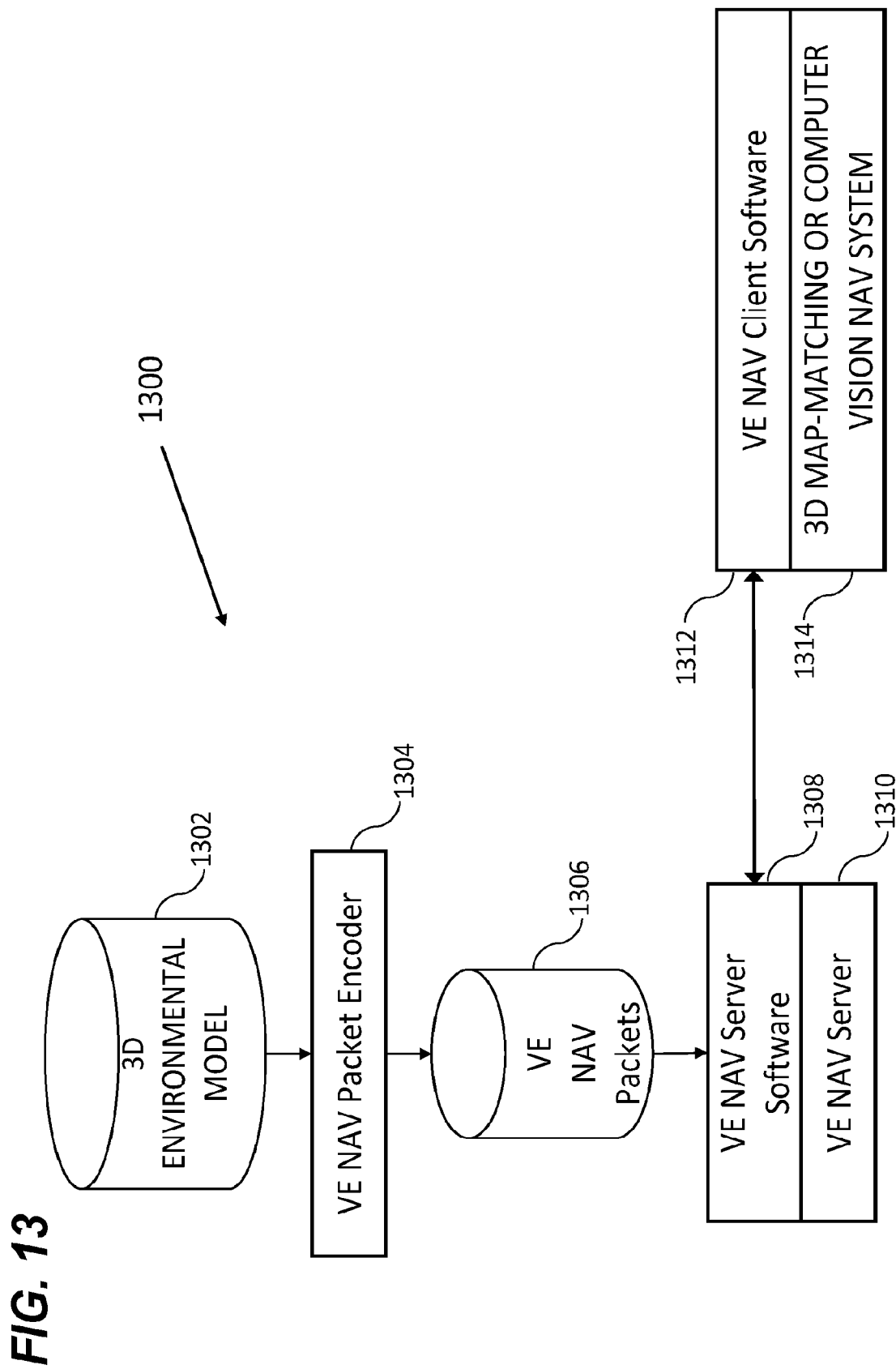
FIG. 13 is a block diagram of a visibility event navigation system workflow, according to certain exemplary aspects.

FIG. 13 is a block diagram of a visibility event navigation system workflow 1300, according to certain exemplary aspects. The visibility event navigation system workflow 1300 describes a high-level architectural block diagram of the visibility event navigation system 100. The visibility event navigation system 100 can be used for streaming visibility event data and other data to navigating client devices 108 such as vehicles, aircraft, and the like. In some aspects, the client devices can be autonomous, semi-autonomous, on-board pilot operated, on-board driver operated, remotely operated, and the like. The server 1310 of the visibility event navigation system 100 can include circuitry that is configured to process and transmit urban and/or natural environmental model surfaces, content, and the like of a 3D environmental model database 1302 to a client device 108 via a network 102.

The circuitry of the server 106 can be configured to deliver the environmental model surfaces and the content of the 3D environmental model database 1302 via a visibility event data stream employing visibility event packets 1306 that are encoded using first-order visibility propagation via a visibility event packet encoder 1304. In certain aspects, the visibility event navigation packets 1306 are precomputed from the 3D environmental model 1302 at an earlier time and stored for later use. The circuitry of the server 1310 can further be configured to run a visibility event server software 1308 in which the visibility event packets 1306 are processed in a visibility event navigation server 1310. The processed visibility event packets 1306 of the server 1310 can be transmitted to a client device 108 in which visibility event client software 1312 employs the processed visibility event packets 1306 in a 3D map-matching or computer vision based navigation system 1314. In certain aspects, the visibility event server software 1308 employs navigation-driven predictive prefetch to transmit the precomputed visibility event packets 1306. In certain aspects, specifying a defined navigational route and streaming the visibility event packets 1306 to client visibility event navigation software 1312 increases the predictability of navigation-driven prefetch and reduces the bandwidth required to stream the packets.

Figure 14:
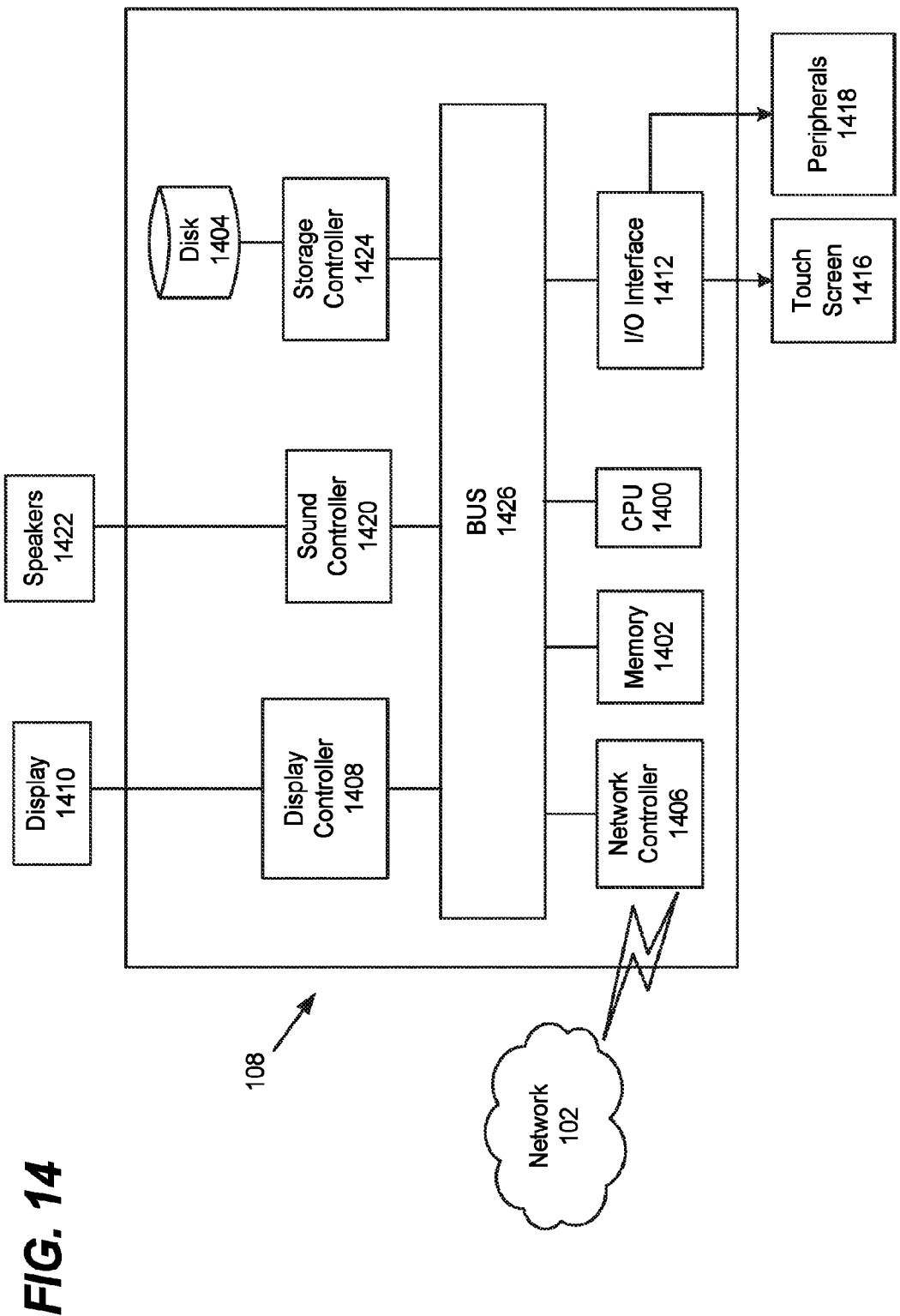
FIG. 14 is a hardware block diagram of a client device, according to certain exemplary aspects.

FIG. 14 is a hardware block diagram of a client device, according to certain exemplary aspects. In FIG. 14, the client device 108 includes a CPU 1400, which performs the processes described above/below. The process data and instructions may be stored in memory 1402. These processes and instructions may also be stored on a storage medium disk 1404 such as a hard drive (HDD) or portable storage medium or may be stored remotely. Further, the claimed advancements are not limited by the form of the computer-readable media on which the instructions of the inventive process are stored. For example, the instructions may be stored on CDs, DVDs, in FLASH memory, RAM, ROM, PROM, EPROM, EEPROM, hard disk, or any other information processing device with which the client device 108 communicates, such as a server or computer.

Further, the claimed advancements may be provided as a utility application, background daemon, or component of an operating system, or combination thereof, executing in conjunction with CPU 1400 and an operating system such as MICROSOFT WINDOWS, UNIX, SOLARIS, LINUX, APPLE MAC-OS, and other systems known to those skilled in the art.

The hardware elements in order to achieve the server 106 may be realized by various circuitry elements, known to those skilled in the art. For example, CPU 1400 may be a XENON or CORE processor from Intel of America or an OPTERON processor from AMD of America, or may be other processor types that would be recognized by one of ordinary skill in the art. Alternatively, the CPU 1400 may be implemented on an FPGA, ASIC, PLD or using discrete logic circuits, as one of ordinary skill in the art would recognize. Further, CPU 1400 may be implemented as multiple processors cooperatively working in parallel to perform the instructions of the inventive processes described above.

The client device 108 in FIG. 14 also includes a network controller 1406, such as an Intel Ethernet PRO network interface card from Intel Corporation of America, for interfacing with a network 102. As can be appreciated, the network 102 can be a public network, such as the Internet, or a private network such as an LAN or WAN network, or any combination thereof and can also include PSTN or ISDN sub-networks. The network 102 can also be wired, such as an Ethernet network, or can be wireless such as a cellular network including EDGE, 3G and 4G wireless cellular systems. The wireless network can also be Wi-Fi, BLUETOOTH, or any other wireless form of communication that is known.

The client device 108 further includes a display controller 1408, such as a NVIDIA GeForce GTX or Quadro graphics adaptor from NVIDIA Corporation of America for interfacing with display 1410, such as a Hewlett Packard HPL2445w LCD monitor. A general purpose I/O interface 1412 interfaces with a touch screen panel 1416 on or separate from display 1410. General purpose I/O interface also connects to a variety of peripherals 1418 including printers and scanners, such as an OfficeJet or DeskJet from Hewlett Packard.

A sound controller 1420 is also provided in the client device 108, such as Sound Blaster X-Fi Titanium from Creative, to interface with speakers/microphone 1422 thereby providing sounds and/or music.

The general purpose storage controller 1424 connects the storage medium disk 1404 with communication bus 1426, which may be an ISA, EISA, VESA, PCI, or similar, for interconnecting all of the components of the client device 108. A description of the general features and functionality of the display 1410, display controller 1408, storage controller 1424, network controller 1406, sound controller 1420, and general purpose I/O interface 1412 is omitted herein for brevity as these features are known.

The exemplary circuit elements described in the context of the present disclosure may be replaced with other elements and structured differently than the examples provided herein. Moreover, circuitry configured to perform features described herein may be implemented in multiple circuit units (e.g., chips), or the features may be combined in circuitry on a single chipset, as shown in FIG. 15.

Figure 15:
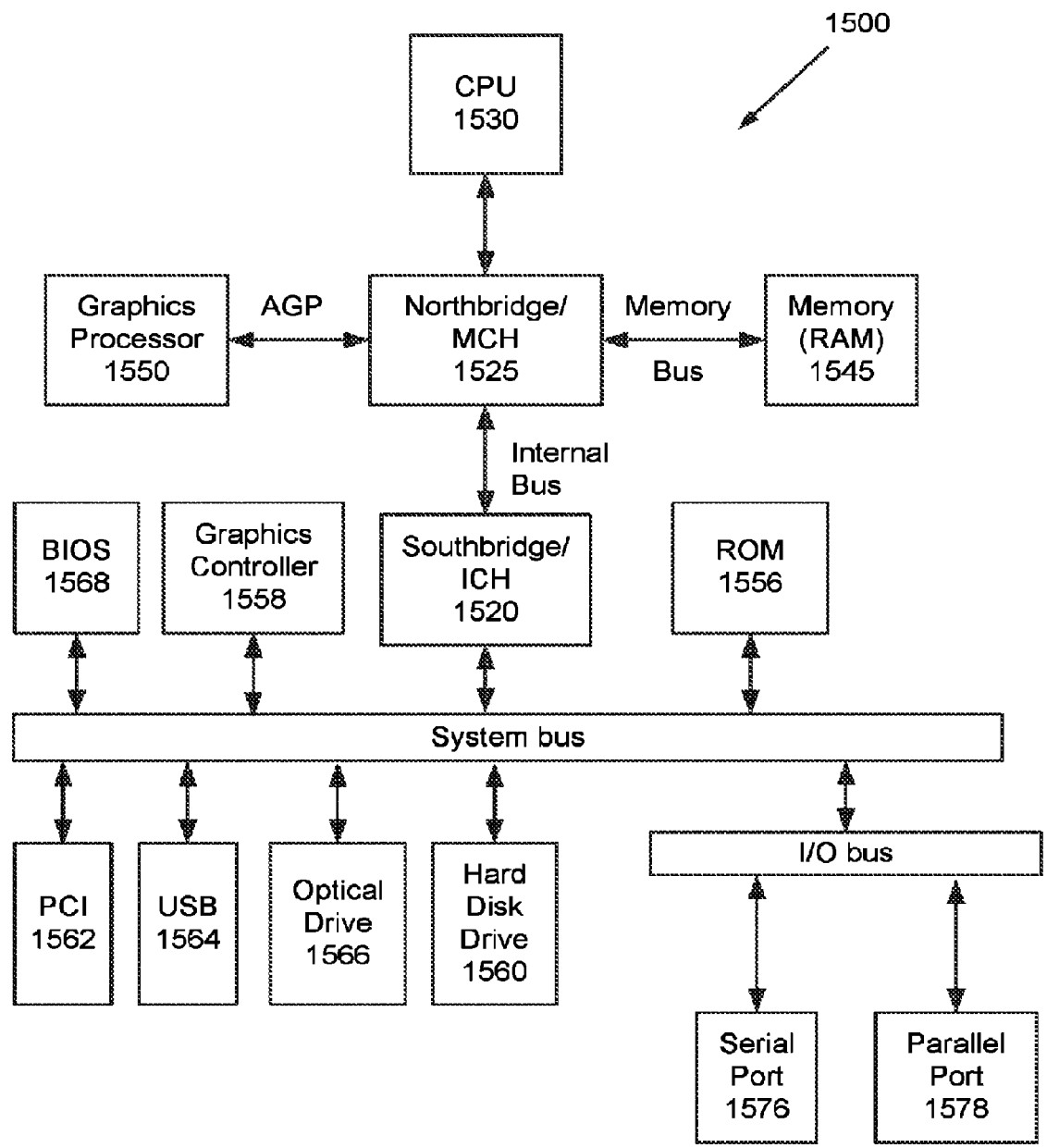
FIG. 15 is a hardware block diagram of a data processing system, according to certain exemplary aspects.

FIG. 15 is a hardware block diagram of a data processing system 1500, according to certain exemplary aspects. FIG. 15 shows a schematic diagram of a data processing system 1500, for performing visibility event navigation. The data processing system 1500 is an example of a computer in which code or instructions implementing the processes of the illustrative aspects may be located.

In FIG. 15, data processing system 1500 employs a hub architecture including a north bridge and memory controller hub (NB/MCH) 1525 and a south bridge and input/output (I/O) controller hub (SB/ICH) 1520. The central processing unit (CPU) 1530 is connected to NB/MCH 1525. The NB/MCH 1525 also connects to the memory 1545 via a memory bus, and connects to the graphics processor 1550 via an accelerated graphics port (AGP). The NB/MCH 1525 also connects to the SB/ICH 1520 via an internal bus (e.g., a unified media interface or a direct media interface). The CPU Processing unit 1530 may contain one or more processors and even may be implemented using one or more heterogeneous processor systems.

Figure 16:
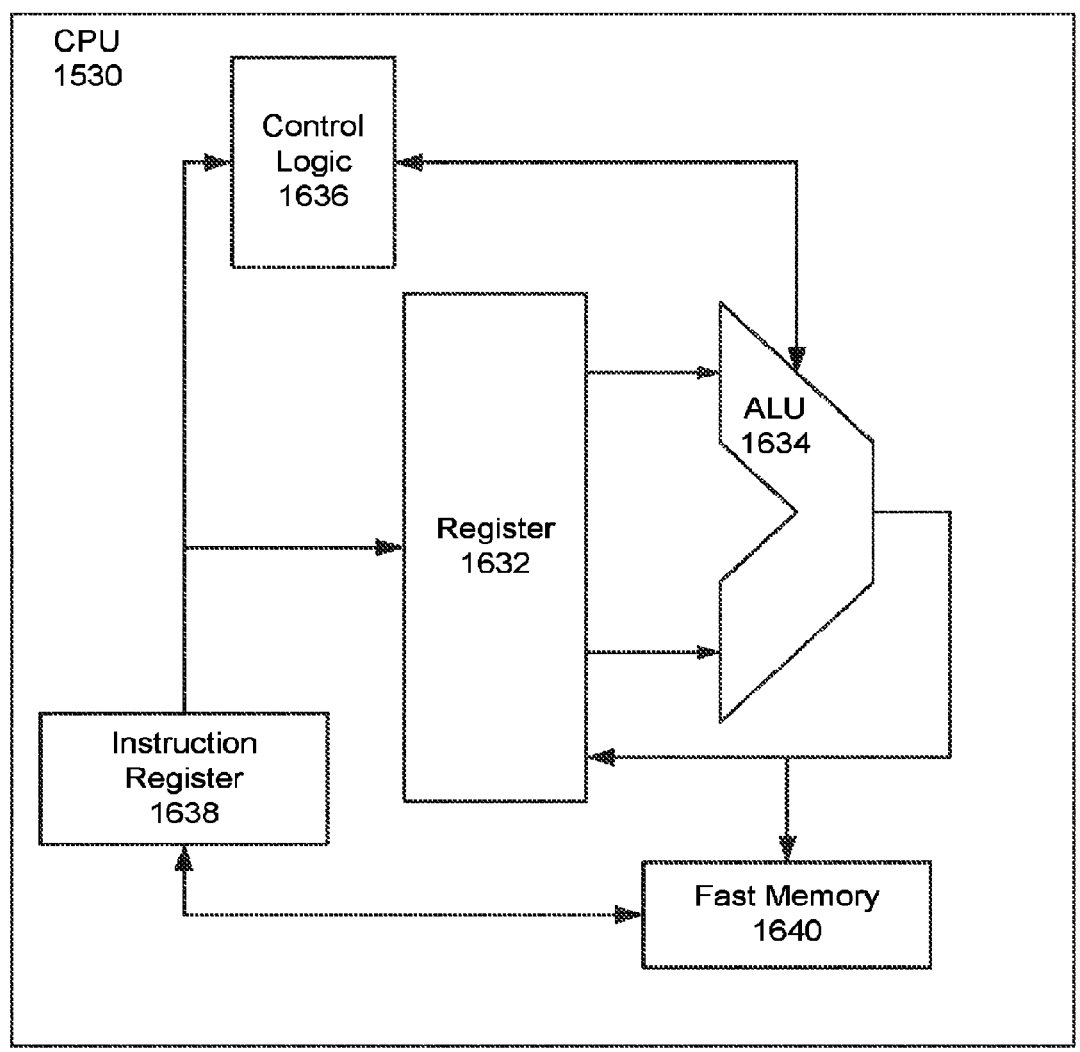
FIG. 16 is a hardware block diagram of a CPU, according to certain exemplary aspects.

FIG. 16 is a hardware block diagram of a CPU, according to certain exemplary aspects. FIG. 16 shows one implementation of CPU 1530. In one implementation, the instruction register 1638 retrieves instructions from the fast memory 1640. At least part of these instructions are fetched from the instruction register 1638 by the control logic 1636 and interpreted according to the instruction set architecture of the CPU 1530. Part of the instructions can also be directed to the register 1632. In one implementation the instructions are decoded according to a hardwired method, and in another implementation the instructions are decoded according a microprogram that translates instructions into sets of CPU configuration signals that are applied sequentially over multiple clock pulses. After fetching and decoding the instructions, the instructions are executed using the arithmetic logic unit (ALU) 1634 that loads values from the register 1632 and performs logical and mathematical operations on the loaded values according to the instructions. The results from these operations can be feedback into the register and/or stored in the fast memory 1640.

According to certain implementations, the instruction set architecture of the CPU 1530 can use a reduced instruction set architecture, a complex instruction set architecture, a vector processor architecture, a very large instruction word architecture. Furthermore, the CPU 1530 can be based on the Von Neuman model or the Harvard model. The CPU 1530 can be a digital signal processor, an FPGA, an ASIC, a PLA, a PLD, or a CPLD. Further, the CPU 1530 can be an x86 processor by Intel or by AMID; an ARM processor, a Power architecture processor by, e.g., IBM; a SPARC architecture processor by Sun Microsystems or by Oracle; or other known CPU architecture.

Referring again to FIG. 15, the data processing system 1500 can include that the SB/ICH 1520 is coupled through a system bus to an I/O Bus, a read only memory (ROM) 1556, universal serial bus (USB) port 1564, a flash binary input/output system (BIOS) 1568, and a graphics controller 1558. PCI/PCIe devices can also be coupled to SB/ICH 1520 through a PCI bus 1562.

The PCI devices may include, for example, Ethernet adapters, add-in cards, and PC cards for notebook computers. The Hard disk drive 1560 and CD-ROM 1566 can use, for example, an integrated drive electronics (IDE) or serial advanced technology attachment (SATA) interface. In one implementation the I/O bus can include a super I/O (SIO) device.

Further, the hard disk drive (HDD) 1560 and optical drive 1566 can also be coupled to the SB/ICH 1520 through a system bus. In one implementation, a parallel port 1578 and a serial port 1576 can be connected to the system bust through the I/O bus. Other peripherals and devices that can be connected to the SB/ICH 1520 using a mass storage controller such as SATA or PATA, an Ethernet port, an ISA bus, a LPC bridge, SMBus, a DMA controller, and an Audio Codec.

The functions and features described herein may also be executed by various distributed components of a system. For example, one or more processors may execute these system functions, wherein the processors are distributed across multiple components communicating in a network. The distributed components may include one or more client and server machines, which may share processing, in addition to various human interface and communication devices (e.g., display monitors, smart phones, tablets, personal digital assistants (PDAs)). The network may be a private network, such as a LAN or WAN, or may be a public network, such as the Internet. Input to the system may be received via direct user input and received remotely either in real-time or as a batch process.

The above-described hardware description is a non-limiting example of corresponding structure for performing the functionality described herein.

A number of implementations have been described. Nevertheless, it will be understood that various modifications may be made without departing from the spirit and scope of this disclosure. For example, preferable results may be achieved if the steps of the disclosed techniques were performed in a different sequence, if components in the disclosed systems were combined in a different manner, or if the components were replaced or supplemented by other components. The functions, processes and algorithms described herein may be performed in hardware or software executed by hardware, including computer processors and/or programmable circuits executing program code and/or computer instructions to execute the functions, processes and algorithms described herein. Additionally, an implementation may be performed on modules or hardware not identical to those described. Accordingly, other implementations are within the scope that may be claimed.

The above disclosure also encompasses the aspects listed below.

(1) A method of visibility event navigation, including one or more visibility event packets located at a server, the one or more visibility event packets including visibility event packet information representing 3D surface elements of a geospatial model that are occluded from a first viewcell and not occluded from a second viewcell, the first and second viewcells representing spatial regions of a navigational route within a real environment modeled by the geospatial model, including: receiving, via processing circuitry of a client device, at least one visibility event packet of the one or more visibility event packets from the server; detecting, via the circuitry, surface information representing one or more visible surfaces of the real environment at a sensor in communication with the client device; calculating, via the circuitry, at least one position of the client device in the real environment by matching the surface information to the visibility event packet information corresponding to a first visibility event packet of the one or more visibility event packets; transmitting, via the circuitry, the at least one position from the client device to the server; and receiving, via the circuitry, at least one second visibility event packet of the one or more visibility event packets when the at least one position is within the navigational route at the client device from the server.

(2) The method of (1), further including: receiving, via the circuitry, at least one alternate visibility event packet of the one or more visibility event packets at the client device from the server, wherein the at least one alternate visibility event packet representing 3D surface elements of the geospatial model that are occluded from a third viewcell but not occluded from a fourth viewcell, the third and fourth viewcells representing spatial regions of a an alternate navigational route within a real environment modeled by the geospatial model, the alternate navigational route leading to a safe landing zone.

(3) The method of either (1) or (2), further including: receiving, via the circuitry, a command for navigation to occur along the alternate navigational route at the client device from the server, when the at least one position is not within the navigational route.

(4) The method of any one of (1) to (3), further including: receiving, via the circuitry, a command for navigation to occur along the alternate navigational route and the safe landing zone when the client fails to receive a signal from the server during a predetermined period of time.

(5) The method of any one of (1) to (4), wherein the client device includes a navigation system for at least one of an autonomous aircraft, a semiautonomous aircraft and a piloted aircraft.

(6) The method of any one of (1) to (5), wherein the safe landing zone includes a specific viewcell as a zone reachable by the autonomous aircraft in case of an engine failure while the autonomous aircraft is in the specific viewcell.

(7) The method of any one of (1) to (6), wherein the safe landing zone includes a specific viewcell as a zone reachable by the piloted aircraft in case of an engine failure while the piloted aircraft is in the specific viewcell.

(8) The method of any one of (1) to (7), further including: detecting, via the circuitry, at least one moving object using the surface information and the visibility event packet information; and transmitting, via the circuitry, information representing the location of the at least one moving object from the client device to the server.

(9) The method of any one of (1) to (8), wherein the real environment is an urban environment, and the geospatial model is a model of the urban environment.

(10) The method of any one of (1) to (9), wherein the real environment is and indoor environment, and the geospatial model is a model of the indoor environment.

(11) The method of any one of (1) to (10), wherein the client device includes a navigation system for at least one of an autonomous ground vehicle and a semiautonomous ground vehicle.

(12) The method of any one of (1) to (11), wherein the client device is a navigational system for a piloted aircraft and the visibility event packet include representations of obstacles hazardous to aviation.

(13) The method of any one of (1) to (12), further including: receiving one or more visibility event packets when a request for the one or more visibility event packets is authenticated by the server.

(14) A method of visibility event navigation, including one or more visibility event packets located at a server, including information representing 3D surface elements of a geospatial model that are occluded from a first viewcell and not occluded from a second viewcell, the first and second viewcells representing spatial regions of a navigational route within a real environment modeled by the geospatial model, including: prefetching, via processing circuitry of the server, a first visibility event packet of the one or more visibility event packets to a client device; receiving, via the circuitry, at least one position of the client device in the real environment at the server; and transmitting, via the circuitry, a second visibility event packet of the one or more visibility event packets to the client device when the at least one position is within the navigational route.

(15) The method of (14), further including: transmitting, via the circuitry, at least one alternate visibility event packet of the one or more visibility event packets from the server to the client, the at least one alternate visibility event packet representing 3D surface elements of the geospatial model that are occluded from a third viewcell but not occluded from a fourth viewcell, the third and fourth viewcells representing spatial regions of an alternate navigational route within a real environment modeled by the geospatial model, the alternate navigational route leading to a safe landing zone.

(16) The method of either (14) or (15), wherein the client device is a navigational system includes at least one of an autonomous aircraft and a semiautonomous aircraft.

(17) The method of any one of (14) to (16), further including: receiving, via the circuitry, at least one object position in the real environment of a moving object at the server from the client device.

(18) The method of any one of (14) to (17), further including: transmitting, via the circuitry, a command for navigation to occur along the alternate navigational route from the server to the client device, when the at least one position is not within the specified navigational route.

(19) The method of any one of (14) to (18), wherein the real environment is an urban environment, and the geospatial model is a model of the urban environment.

(20) The method of any one of (14) to (19), wherein the real environment is an indoor environment, and the geospatial model is a model of the indoor environment.

(21) A method of visibility event navigation prefetch, including at least one partial visibility event packet including a subset of a complete visibility event packet, the complete visibility event packet including information representing 3D surface elements of a geospatial model occluded from a first viewcell and not occluded from a second viewcell, the first and second viewcells representing spatial regions of a navigational route within a real environment modeled by the geospatial model, including: receiving, via processing circuitry of a server, information at the server from a client device representing an orientation of a sensor located at the client device, the sensor acquiring information representing the visible surfaces of the real environment; and transmitting, via the circuitry, the at least one partial visibility event packet from the server to the client device, wherein the at least one partial visibility event packet intersects a maximal view frustum including a volume of space intersected by the view frustum of the sensor during movement of the client device in the second viewcell.

(22) A method of visibility event navigation, including at least one partial visibility event packet located at a server, the at least one partial visibility event packet including a subset of a complete visibility event packet, the complete visibility event packet including visibility event packet information representing 3D surface elements of a geospatial model occluded from a first viewcell and not occluded from a second viewcell, the first and second viewcells representing spatial regions of a navigational route within a real environment modeled by the geospatial model, including: transmitting, via processing circuitry of a client device, surface information from the client device to the server corresponding to the orientation of a sensor located at the client device, the surface information representing visible surfaces of the real environment; and receiving, via the circuitry, the at least one partial visibility event packet at the client device from the server including a subset of the visibility event packet information that intersects a maximal view frustum, wherein the maximal view frustum includes a volume of space intersected by a view frustum of the sensor during movement of the client device in the second viewcell.

(23) A method of visibility event navigation, including a first visibility event packet of one or more visibility event packets from a server, the one or more visibility event packets including visibility event packet information representing 3D surface elements of a geospatial model that are occluded from a first viewcell and not occluded from a second viewcell, the first and second viewcells representing spatial regions of a navigational route within a real environment modeled by the geospatial model, including: detecting, via processing circuitry of a first client device of a plurality of client devices, surface information representing visible surfaces of the real environment at a sensor in communication with the first client device of the plurality of client device; calculating, via the circuitry, at least one position of the first client device of the plurality of client devices in the real environment by matching the surface information to the visibility event packet information; transmitting, via the circuitry, the at least one position from the first client device of the plurality of client devices to the server; receiving, via the circuitry, at least one second visibility event packet of the one or more visibility event packets at the first client device of the plurality of client devices from the server when the at least one position is within the navigational route; detecting, via the circuitry, position information representing the position of at least one second client device of the one or more client devices in the real environment at the sensor; and transmitting, via the circuitry, the position information from the first client device of the plurality of client devices to the server.

(24) A method of visibility event navigation prefetch, including a first visibility event packet of one or more visibility event packets, the one or more visibility event packets including visibility event packet information representing 3D surface elements of a geospatial model that are occluded from a first viewcell and not occluded from a second viewcell, the first and second viewcells representing spatial regions of a navigational route within a real environment modeled by the geospatial model, including: receiving, via processing circuitry of a server, at least one position of a client device in the real environment at the server from the client device; and transmitting, via the circuitry, a second visibility event packet of the one or more visibility event packets when the at least one position of the client device is within the navigational route and a fee has been paid by an operator of the client device.

(25) A method of visibility event navigation, including one or more visibility event packets located at a server, the one or more visibility event packets including visibility event packet information representing 3D surface elements of a geospatial model that are occluded from a first viewcell and not occluded from a second viewcell, the first and second viewcells representing spatial regions of a navigational route within a real environment modeled by the geospatial model, including: receiving, via processing circuitry of a client device, at least one visibility event packet of the one or more visibility event packets from the server; detecting, via processing circuitry of the client device, surface information representing one or more visible surfaces of the real environment at a sensor in communication with the client device; calculating, via the circuitry, at least one position of the client device in the real environment by matching the surface information to the visibility event packet information corresponding to the first visibility event packet of the one or more visibility event packets; transmitting, via the circuitry, the at least one position in the real environment from the client device to the server; receiving, via the circuitry, at least one second visibility event packet from the server of the one or more visibility event packets at the client device from the server; calculating, via the circuitry, at least one deviation of the ground-truth 3D structure from the corresponding environment modeled by the geospatial model using the surface information and the visibility event packet information; and transmitting, via the circuitry, the at least one deviation from the client device to the server.

(26) A visibility event navigation system, including: a server; at least one client device located in a real environment and in communication with the server, the at least one client device including processing circuitry configured to: detect surface information representing one or more visible surfaces of the real environment at one or more sensors in communication with the at least one client device, calculate at least one position of the at least one client device in the real environment by matching the surface information to visibility event packet information including a first visibility event packet of one or more visibility event packets representing 3D surface elements of a geospatial model that are occluded from a first viewcell and not occluded from a second viewcell, the first and second viewcells representing spatial regions of a navigational route within the real environment and modeled by the geospatial model, transmit the at least one position of the client device to the server, and receive a second visibility event packet of the one or more visibility event packets from the server when the at least one position is within the navigational route.

The invention claimed is:

1. A method of visibility event navigation, including one or more visibility event packets located at a server, the one or more visibility event packets including visibility event packet information representing 3D surface elements of a geospatial model that are occluded from a first viewcell and not occluded from a second viewcell, the first and second viewcells representing spatial regions of a navigational route within a real environment modeled by the geospatial model, comprising:

receiving, via processing circuitry of a client device, at least one visibility event packet of the one or more visibility event packets from the server;

detecting, via the circuitry, surface information representing one or more visible surfaces of the real environment at a sensor in communication with the client device;

calculating, via the circuitry, at least one position of the client device in the real environment by matching the surface information to the visibility event packet information corresponding to a first visibility event packet of the one or more visibility event packets;

transmitting, via the circuitry, the at least one position from the client device to the server; and receiving, via the circuitry, at least one second visibility event packet of the one or more visibility event packets when the at least one position is within the navigational route at the client device from the server.

2. The method of claim 1, further comprising:
receiving, via the circuitry, at least one alternate visibility event packet of the one or more visibility event packets at the client device from the server, wherein the at least one alternate visibility event packet representing 3D surface elements of the geospatial model that are occluded from a third viewcell but not occluded from a fourth viewcell, the third and fourth viewcells representing spatial regions of an alternate navigational route within a real environment modeled by the geospatial model, the alternate navigational route leading to a safe landing zone.

3. The method of claim 2, further comprising:
receiving, via the circuitry, a command for navigation to occur along the alternate navigational route at the client device from the server, when the at least one position is not within the navigational route.

4. The method of claim 2, further comprising:
receiving, via the circuitry, a command for navigation to occur along the alternate navigational route and the safe landing zone when the client fails to receive a signal from the server during a predetermined period of time.

5. The method of claim 2, wherein the client device includes a navigation system for at least one of an autonomous aircraft, a semiautonomous aircraft and a piloted aircraft.

6. The method of claim 5, wherein the safe landing zone includes a specific viewcell as a zone reachable by the autonomous aircraft in case of an engine failure while the autonomous aircraft is in the specific viewcell.

7. The method of claim 5, wherein the safe landing zone includes a specific viewcell as a zone reachable by the piloted aircraft in case of an engine failure while the piloted aircraft is in the specific viewcell.

8. The method of claim 1, further comprising:
detecting, via the circuitry, at least one moving object using the surface information and the visibility event packet information; and
transmitting, via the circuitry, information representing the location of the at least one moving object from the client device to the server.

9. The method of claim 1, wherein the real environment is an urban environment, and the geospatial model is a model of the urban environment.

10. The method of claim 1, wherein the real environment is an indoor environment, and the geospatial model is a model of the indoor environment.

11. The method of claim 1, wherein the client device includes a navigation system for at least one of an autonomous ground vehicle and a semiautonomous ground vehicle.

12. The method of claim 1, wherein the client device is a navigational system for a piloted aircraft and the visibility event packet includes representations of obstacles hazardous to aviation.

13. The method of claim 1, further comprising:
receiving one or more visibility event packets when a request for the one or more visibility event packets is authenticated by the server.

14. A method of visibility event navigation, including one or more visibility event packets located at a server, including information representing 3D surface elements of a geospatial model that are occluded from a first viewcell and not occluded from a second viewcell, the first and second viewcells representing spatial regions of a navigational route within a real environment modeled by the geospatial model, comprising:
prefetching, via processing circuitry of the server, a first visibility event packet of the one or more visibility event packets to a client device;
receiving, via the circuitry, at least one position of the client device in the real environment at the server; and
transmitting, via the circuitry, a second visibility event packet of the one or more visibility event packets to the client device when the at least one position is within the navigational route.

15. The method of claim 14, further comprising:
transmitting, via the circuitry, at least one alternate visibility event packet of the one or more visibility event packets from the server to the client, the at least one alternate visibility event packet representing 3D surface elements of the geospatial model that are occluded from a third viewcell but not occluded from a fourth viewcell, the third and fourth viewcells representing spatial regions of an alternate navigational route within a real environment modeled by the geospatial model, the alternate navigational route leading to a safe landing zone.

16. The method of claim 14, wherein the client device is a navigational system includes at least one of an autonomous aircraft and a semiautonomous aircraft.

17. The method of claim 16, further comprising:
receiving, via the circuitry, at least one object position in the real environment of a moving object at the server from the client device.

18. The method of claim 16, further comprising:
transmitting, via the circuitry, a command for navigation to occur along the alternate navigational route from the server to the client device, when the at least one position is not within the specified navigational route.

19. The method of claim 14, wherein the real environment is an urban environment, and the geospatial model is a model of the urban environment.

20. The method of claim 14, wherein the real environment is an indoor environment, and the geospatial model is a model of the indoor environment.

21. A method of visibility event navigation prefetch, including at least one partial visibility event packet including a subset of a complete visibility event packet, the complete visibility event packet including information representing 3D surface elements of a geospatial model occluded from a first viewcell and not occluded from a second viewcell, the first and second viewcells representing spatial regions of a navigational route within a real environment modeled by the geospatial model, comprising:
receiving, via processing circuitry of a server, information at the server from a client device representing an orientation of a sensor located at the client device, the sensor acquiring information representing the visible surfaces of the real environment; and transmitting, via the circuitry, the at least one partial visibility event packet from the server to the client device, wherein the at least one partial visibility event packet intersects a maximal view frustum including a volume of space intersected by the view frustum of the sensor during movement of the client device in the second viewcell.

22. A method of visibility event navigation, including at least one partial visibility event packet located at a server, the at least one partial visibility event packet including a subset of a complete visibility event packet, the complete visibility event packet including visibility event packet information representing 3D surface elements of a geospatial model occluded from a first viewcell and not occluded from a second viewcell, the first and second viewcells representing spatial regions of a navigational route within a real environment modeled by the geospatial model, comprising:

transmitting, via processing circuitry of a client device, surface information from the client device to the server corresponding to the orientation of a sensor located at the client device, the surface information representing visible surfaces of the real environment; and receiving, via the circuitry, the at least one partial visibility event packet at the client device from the server including a subset of the visibility event packet information that intersects a maximal view frustum, wherein the maximal view frustum includes a volume of space intersected by a view frustum of the sensor during movement of the client device in the second viewcell.

23. A method of visibility event navigation, including a first visibility event packet of one or more visibility event packets from a server, the one or more visibility event packets including visibility event packet information representing 3D surface elements of a geospatial model that are occluded from a first viewcell and not occluded from a second viewcell, the first and second viewcells representing spatial regions of a navigational route within a real environment modeled by the geospatial model, comprising:

detecting, via processing circuitry of a first client device of a plurality of client devices, surface information representing visible surfaces of the real environment at a sensor in communication with the first client device of the plurality of client device;

calculating, via the circuitry, at least one position of the first client device of the plurality of client devices in the real environment by matching the surface information to the visibility event packet information;

transmitting, via the circuitry, the at least one position from the first client device of the plurality of client devices to the server;

receiving, via the circuitry, at least one second visibility event packet of the one or more visibility event packets at the first client device of the plurality of client devices from the server when the at least one position is within the navigational route;

detecting, via the circuitry, position information representing the position of at least one second client device of the one or more client devices in the real environment at the sensor; and transmitting, via the circuitry, the position information from the first client device of the plurality of client devices to the server.

24. A method of visibility event navigation prefetch, including a first visibility event packet of one or more visibility event packets, the one or more visibility event packets including visibility event packet information representing 3D surface elements of a geospatial model that are occluded from a first viewcell and not occluded from a second viewcell, the first and second viewcells representing spatial regions of a navigational route within a real environment modeled by the geospatial model, comprising:

receiving, via processing circuitry of a server, at least one position of a client device in the real environment at the server from the client device; and transmitting, via the circuitry, a second visibility event packet of the one or more visibility event packets when the at least one position of the client device is within the navigational route and a fee has been paid by an operator of the client device.

25. A method of visibility event navigation, including one or more visibility event packets located at a server, the one or more visibility event packets including visibility event packet information representing 3D surface elements of a geospatial model that are occluded from a first viewcell and not occluded from a second viewcell, the first and second viewcells representing spatial regions of a navigational route within a real environment modeled by the geospatial model, comprising:

receiving, via processing circuitry of a client device, at least one visibility event packet of the one or more visibility event packets from the server;

detecting, via processing circuitry of the client device, surface information representing one or more visible surfaces of the real environment at a sensor in communication with the client device;

calculating, via the circuitry, at least one position of the client device in the real environment by matching the surface information to the visibility event packet information corresponding to the first visibility event packet of the one or more visibility event packets;

transmitting, via the circuitry, the at least one position in the real environment from the client device to the server;

receiving, via the circuitry, at least one second visibility event packet from the server of the one or more visibility event packets at the client device from the server;

calculating, via the circuitry, at least one deviation of the ground-truth 3D structure from the corresponding environment modeled by the geospatial model using the surface information and the visibility event packet information; and transmitting, via the circuitry, the at least one deviation from the client device to the server.

26. A visibility event navigation system, comprising:

a server;

at least one client device located in a real environment and in communication with the server, the at least one client device including processing circuitry configured to:

detect surface information representing one or more visible surfaces of the real environment at one or more sensors in communication with the at least one client device, calculate at least one position of the at least one client device in the real environment by matching the surface information to visibility event packet information including a first visibility event packet of one or more visibility event packets representing 3D surface elements of a geospatial model that are occluded from a first viewcell and not occluded from a second viewcell, the first and second viewcells representing spatial regions of a navigational route within the real environment and modeled by the geospatial model, transmit the at least one position of the client device to the server, and receive a second visibility event packet of the one or more visibility event packets from the server when the at least one position is within the navigational route.

* * * * *